United States Patent
El-Kady et al.

(10) Patent No.: US 8,508,370 B1
(45) Date of Patent: *Aug. 13, 2013

(54) SYNTHETIC THERMOELECTRIC MATERIALS COMPRISING PHONONIC CRYSTALS

(75) Inventors: Ihab F. El-Kady, Albuquerque, NM (US); Roy H. Olsson, Albuquerque, NM (US); Patrick Hopkins, Albuquerque, NM (US); Charles Reinke, Albuquerque, NM (US); Bongsang Kim, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 230 days.

This patent is subject to a terminal disclaimer.

(21) Appl. No.: 13/156,647

(22) Filed: Jun. 9, 2011

Related U.S. Application Data

(63) Continuation-in-part of application No. 12/394,831, filed on Feb. 27, 2009, now Pat. No. 8,094,023.

(60) Provisional application No. 61/353,844, filed on Jun. 11, 2010.

(51) Int. Cl.
*G08B 13/14* (2006.01)

(52) U.S. Cl.
USPC ............ 340/572.1; 340/568.1; 340/660

(58) Field of Classification Search
USPC ......... 340/572.1–572.9, 539.1, 568.1, 586.1, 340/622, 643, 660
See application file for complete search history.

(56) References Cited

U.S. PATENT DOCUMENTS

| | | | | |
|---|---|---|---|---|
| 6,362,303 | B1 * | 3/2002 | Byker et al. | 528/76 |
| 6,396,191 | B1 * | 5/2002 | Hagelstein et al. | 310/306 |
| 7,309,830 | B2 * | 12/2007 | Zhang et al. | 136/236.1 |
| 8,094,023 | B1 * | 1/2012 | El-Kady et al. | 340/572.1 |

* cited by examiner

*Primary Examiner* — Daniel Previl
(74) *Attorney, Agent, or Firm* — Kevin W. Bieg

(57) ABSTRACT

Synthetic thermoelectric materials comprising phononic crystals can simultaneously have a large Seebeck coefficient, high electrical conductivity, and low thermal conductivity. Such synthetic thermoelectric materials can enable improved thermoelectric devices, such as thermoelectric generators and coolers, with improved performance. Such synthetic thermoelectric materials and devices can be fabricated using techniques that are compatible with standard microelectronics.

20 Claims, 21 Drawing Sheets

SYNTHETIC THERMOELECTRIC MATERIALS COMPRISING PHONONIC CRYSTALS

CROSS-REFERENCE TO RELATED APPLICATIONS

This application is a continuation-in-part of application Ser. No. 12/394,831, filed Feb. 27, 2009 now U.S. Pat. No. 8,094,023, which is incorporated herein by reference. This application claims the benefit of U.S. Provisional Application No. 61/353,844, filed Jun. 11, 2010, which is incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to thermoelectric materials and devices and, in particular, to synthetic thermoelectric materials comprising phononic crystals and thermoelectric devices made therewith.

BACKGROUND OF THE INVENTION

The thermoelectric (TE) effect refers to phenomena in which a temperature difference creates an electric potential, or an electric potential creates a temperature difference. Therefore, a thermoelectric device creates a voltage when there is a different temperature imposed on opposing sides of the device or, when a voltage is applied across it, the device creates a temperature difference.

A thermoelectric material is a material that shows a strong thermoelectric effect. The performance of thermoelectric materials used in thermoelectric devices is measured using the dimensionless figure-of-merit $ZT=S^2\sigma T/\kappa$, where $S$ is the Seebeck coefficient, $\sigma$ is the electrical conductivity, $\kappa$ is the thermal conductivity, and $T$ is the temperature in Kelvin. Since $S$ is a fundamental material property that also affects the electrical conductivity, most attempts on increasing ZT have focused on enhancing $\sigma$ and/or suppressing $\kappa$. Since electrons conduct both heat and electricity, it has proven to be a difficult task to ensure the increase in $\sigma$ at the expense of $\kappa$.

The efficiency of thermoelectric devices is dependent on several materials properties. As described above, it can be quantified by the dimensionless thermoelectric figure-of-merit, ZT. One of the most promising approaches for bulk thermoelectric materials preparation is to create highly doped, small band-gap semiconductors. The problem is that the three parameters in ZT ($S$, $\sigma$, and $\kappa$) are not independent. In general, as $S$ increases, $\sigma$ decreases. The best compromise seems to be using heavily doped semiconductors to produce a carrier density of about $10^{19}/cm^3$. Furthermore, $\kappa$ has two contributions, one from the electrical carriers, $\kappa_e$, and one from the lattice vibrations (phonons), $\kappa_{ph}$. Although $\kappa_e$ is proportional to $\sigma$, in many semiconductors $\kappa_{ph}$ is much greater than $\kappa_e$, so that the major challenge, short of changing the material, is to minimize $\kappa_{ph}$.

In the standard model of semiconductor transport, it can be shown that ZT is a monotonically increasing function of two parameters: $E_G$ and B, where $E_G$ is the band gap and B is determined by a number of materials parameters. See A. S. Henry and G. Chen, *J. Computational and Theoretical Nanoscience* 5, 1 (2008). In this analysis, it is assumed that the semiconductor carrier density (n- or p-type) has been adjusted by doping to the optimal level. Then, the band gap $E_G$ must be greater than kT (the thermal energy) by a factor of about 10 to maximize ZT for a given B. B is a product of several factors: $B \sim N_v \mu m^{3/2}/\kappa_{ph}$. $N_v$ is the degeneracy of the band extrema near the Fermi level, $\mu$ is the electronic mobility, and m is the band mass determined by the density of states. Each parameter can be considered in turn. The crystalline symmetry limits the maximum value of $N_v$, and it attains its maximum value in cubic space groups (in which case it might be as high as 48). For high ZT, the electronic mobility $\mu$ should be high, but generally, the mobility and the band mass m are not independent. The mobility is inversely proportional to the band mass in the direction of the current flow, $m_i$, according to: $\mu = e\tau/m_i$, where $\tau$ is the carrier scattering time. Thus, B is proportional to $N_v\tau(m)^{3/2}/m_i\kappa_{ph}$. In non-cubic materials, $m_i$ can be different from m. In that case, when $m > m_i$, B is increased. However, exploiting an anisotropic mass may run counter to increasing $N_v$, so a compromise must be struck. Interestingly, the current TE materials all have cubic or hexagonal symmetry. Finally, long scattering times are possible if the electronegativity differences between the elements in the material are small and optical vibrations have small coupling to the carriers. The latter condition is difficult to control or design, but small coupling is favored if the each atom has a large number of near neighbors, say six or greater.

Most current high-ZT research efforts focus on reducing the thermal conductivity in semiconductor materials with favorable Seebeck coefficients while enhancing electrical conductivity, and can be broadly categorized by materials type as uniform bulk materials, compositionally modulated films, and nanostructured materials. With all of these material systems, the approach typically involves starting with a bulk material that either has a large electrical conductivity or that can be doped to increase the electrical conductivity of the material, and then reducing the thermal conductivity due to phonons as much as possible without impacting the electrical conductivity.

The simplest approach to a high-ZT material is to choose a conducting (or semiconducting) material that has a small thermal conductivity. Such materials tend to be compounds made from heavy elements, as the high atomic masses reduce the atomic vibration frequencies and hence the thermal conductivity (at room temperature and greater). However, the low vibration frequencies reduce the electrical conductivity as well. Other approaches include having a large number of atoms (N) in the unit cell of crystalline compounds or using alloys to prepare structurally complex materials. The large N lowers the fraction of vibrational modes (phonons) that carry heat efficiently (acoustic modes) to 1/N, whereas the disorder of random atomic substitution in an alloy scatters the phonons, which reduces the thermal conductivity. In both cases, the distance between the scattering centers can be difficult to control and may approach the mean free path of electrons in the material, reducing the electrical conductivity. See G. A. Slack, *CRC Handbook of Thermoelectrics*, Boca Raton, Fla.: CRC Press (1995). Thus, this approach is limited by the mechanisms that can be used to tune material properties, with essentially no capability for reducing the thermal conductivity independent of the electrical conductivity.

The compositionally modulated films used to create synthetic high-ZT materials generally fall into two categories: devices in which current and heat flow parallel to the layers, and ones in which both flow perpendicular to the layers. In the first approach, an increase in Z has been calculated to arise from a number of factors, including an increase in the electronic density of states per unit volume that consequently increases the thermopower that would occur for small well widths (several nanometers), as well as an increase in carrier mobility if modulation doping is exploited. See M. G. Holland, *Physical Review* 132, 2461 (1963). A potential difficulty in obtaining higher ZT from such devices is that the inert spacers used to separate the active layers of such structures do not contribute to heat flow, but have a thermal conductivity that increases the heat load and lowers the effective ZT of the overall device. The second approach has demonstrated a much more profound effect on phonon transport, either through phonon confinement or phonon scattering mechanisms, using layered structures that minimize the impact of the barrier layer on the electrical conductivity. However, these techniques rely on costly and time consuming growth fabrication processes, and often utilize materials that can be challenging to pattern or incorporate with standard microelectronics. See A. Balandin and K. L. Wang, *Journal of Applied Physics* 84, 6149 (1998); G. Chen, *Physical Review B* 57, 14958 (1998); and R. Venkatasubramanian, *Physical Review B* 61, 3091 (2000).

The nanostructured materials approach to increasing ZT also attempts to reduce thermal conductivity through boundary layer scattering, either by constraining the dimensionality of the material by creating structures such as nanowires and quantum dots, or using either random or periodic defects in a bulk TE material. In this approach, defects with length scales on the order of the mean free path of phonons in the bulk material are used to effectively scatter thermal phonons and thus reduce the thermal conductivity of the composite material. See C. Chiritescu et al., *Science* 315, 351 (2007); and R. Venkatasubramanian et al., *Nature* 413, 597 (2001). The method using low-dimensional structures such as nanowires have been shown to dramatically reduce the thermal conductivity versus bulk materials of the same composition by phonon drag in the highly-confined nanowire and phonon scattering from the boundaries of the structure. See A. I. Hochbaum et al., *Nature* 451, 163 2008; and J.-K. Yu et al., *Nature Nanotechnology*, advance online publication 2010. Despite the impressive ZT values of such structures, they are impractical from a device point of view due to the inherent small usable material area and structural fragility of such topologies. Attempts to alleviate these issues with nanomeshes and arrays of nanowires result in only modest improvements in the structural integrity at best. The random defect approach has demonstrated significant thermal conductivity reduction without the need for complicated fabrication techniques and without removing a large fraction of the bulk solid area, but with limited degrees of freedom to optimize the effect besides rough control of the defect size and density. See C. Chiritescu et al., *Science* 315, 351 (2007).

Therefore, a need remains for a thermoelectric material that has a large Seebeck coefficient, high electrical conductivity, and low thermal conductivity and can be fabricated into devices using techniques that are compatible with standard microelectronics.

SUMMARY OF THE INVENTION

The present invention is directed to a synthetic thermoelectric material, comprising a phononic crystal (PnC) comprising a periodic array of scattering centers embedded in a host matrix, wherein the scattering center material has a different acoustic impedance than the host matrix material, thereby providing a phononic bandgap, and wherein the host matrix material comprises a thermoelectric material. The periodic array can comprise a one-, two-, or three-dimensional array. For example, the thermoelectric material can comprise an n- or p-type semiconductor, preferably a highly doped semiconductor, such as doped silicon or silicon carbide. For example, the scattering center material can comprise air, silicon oxide, polysilicon, or tungsten. The phononic bandgap can provide a reduced thermal conductivity of the synthetic thermoelectric material compared to the thermoelectric material.

Phononic crystals are the acoustic wave analog of photonic crystals, where a periodic array of scattering inclusions located in a homogeneous host material causes certain frequencies to be completely reflected by the structure. In conjunction with creating a phononic bandgap, anomalous dispersion accompanied by a large reduction in phonon group velocities can lead to a massive reduction in thermal conductivity. For example, the thermal conductivity of a single crystalline silicon phononic crystal can be over an order of magnitude lower than bulk silicon.

The synthetic thermoelectric material can exhibit both high electrical conductivity and low thermal conductivity simultaneously. For example, at THz frequencies, the phonon contribution to heat transport in a thermoelectric material can be significantly reduced, decreasing the thermal conductivity while leaving the electrical conductivity either unchanged or increased. Reaching the frequency range to significantly alter phononic heat transport through a thermoelectric material requires patterning of periodic structures on the nanometer length scale.

Such synthetic thermoelectric materials can significantly enhance the efficiency of thermoelectric generators and coolers. Therefore, the present invention is also directed to a thermoelectric device, comprising a first synthetic thermoelectric material layer comprising a phononic crystal comprising a two-dimensional periodic array of scattering centers embedded in a host matrix comprising a n-type semiconductor thermoelectric material, wherein the scattering center material has a different acoustic impedance than the host matrix material; and a second synthetic thermoelectric material layer comprising a phononic comprising a two-dimensional periodic array of scattering centers embedded in a host matrix comprising a p-type semiconductor thermoelectric material, wherein the scattering center material has a different acoustic impedance than the host matrix material; and wherein the first and second synthetic thermoelectric material layers are electrically connected at a hot side, thereby providing a first pair of synthetic thermoelectric material layers, and the opposite cold sides of the first pair are connected via a thermoelectric power circuit. The first pair of synthetic thermoelectric material layers can be arranged as co-planar layers or as stacked layers. The thermoelectric device can further comprise at least one additional pair of synthetic thermoelectric material layers stacked layer-by-layer with the first pair of stacked layers to provide a first module. The thermoelectric device of can further comprise at least one additional module staged side-by-side with the first module to provide a cascaded thermoelectric device. The additional pairs of synthetic thermoelectric material layers can be connected in series or in parallel with the first pair. A thermoelectric generator is obtained when heat is applied to the hot side and a voltage is generated in the thermoelectric power circuit. Alternatively, a thermoelectric cooler is obtained when a voltage is applied to the thermoelectric power circuit and heat is extracted from the hot side.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

FIG. 6(b) is a side image of a phononic crystal membrane showing its suspension above the substrate.

FIG. 17(a) shows an n-type SOI Si wafers. FIG. 17(b) shows a nano-scale hole pattern etched into top-Si layer. FIG. 17(c) shows the nano-holes back filled with SiO$_2$. FIG. 17(d) shows a thick Si film deposited in an epi-reactor. Epitaxial single crystal Si will form over areas where single crystal Si is exposed. Polycrystalline Si will form over areas where SiO$_2$ is exposed. The result is a thick n-type Si/PolySi phononic lattice. FIG. 17(e) shows the n-type Si/PolySi phononic lattice bonded to a similarly fabricated p-type Si/PolySi phononic lattice to form a thermoelectric element.

DETAILED DESCRIPTION OF THE INVENTION

Figure 1:
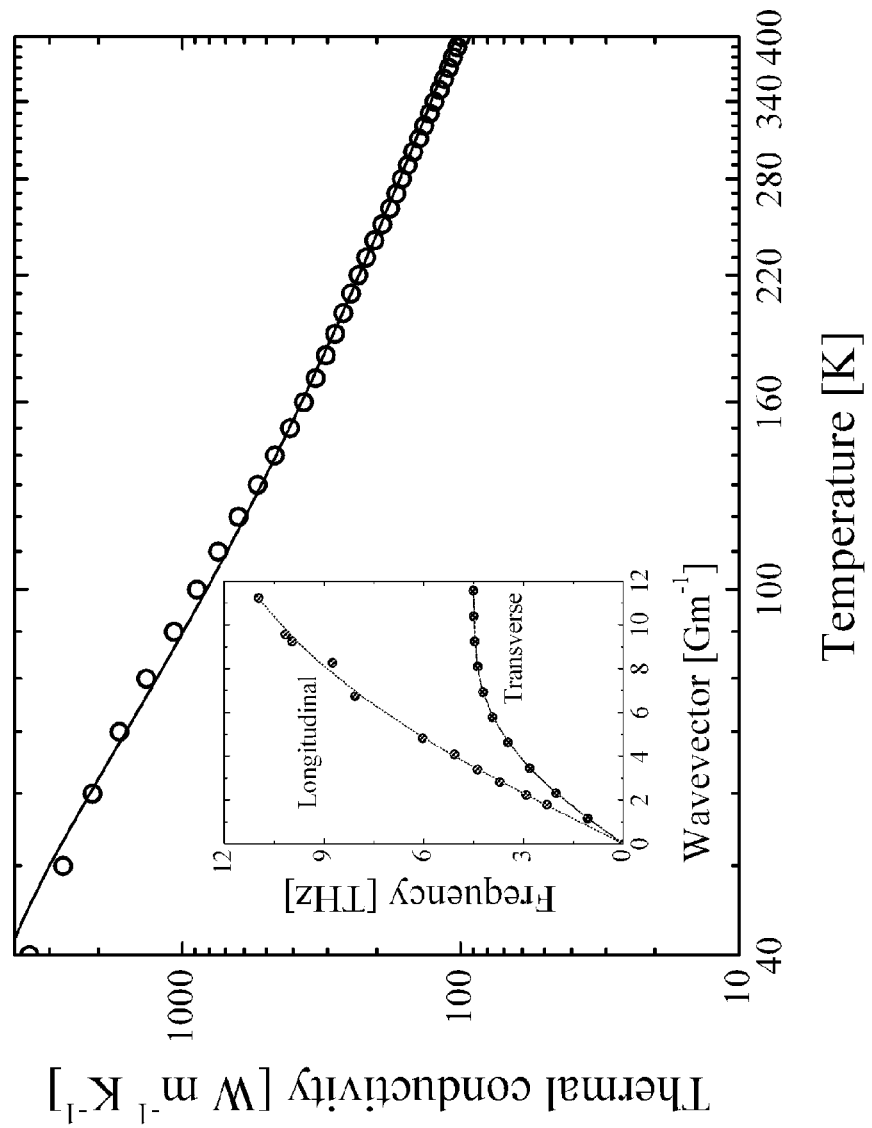
FIG. 1 is a graph of the thermal conductivity model fit to experimental data on single crystalline Si. The inset is a graph of the dispersion data from bulk Si and polynomial fit.

The present invention is directed synthetic thermoelectric materials comprising phononic crystals. Phononic crystals are formed by the periodic arrangement of scattering centers in a host matrix with a high acoustic impedance mismatch between the scattering centers and the host matrix. When a high acoustic impedance mismatch is maintained between the scattering centers and the host matrix, the superposition of Mie and Bragg resonant scattering results in the creation of a phononic band gap where phonons are forbidden, thereby reducing phonon thermal conductivity. The phononic crystal can comprise a one-dimensional, two-dimensional, or three-dimensional arrangement of scattering centers. For thermoelectric applications, the host matrix comprises a thermoelectric material. For example, the thermoelectric material can comprise highly doped silicon. For high temperature applications, the thermoelectric material can comprise highly doped silicon carbide. Both of these silicon-based materials are CMOS compatible. However, other thermoelectric materials and alloys that have favorable low-temperature thermoelectric properties, such as Bi$_2$Te$_3$, and that can benefit from a reduction in thermal conductivity, can also be used. The scattering material can be, for example, air, polysilicon, $SiO_2$, tungsten, or any other material that has a high impedance mismatch with the host thermoelectric material. See U.S. Pat. No. 7,836,566, which is incorporated herein by reference. Such synthetic thermoelectric materials comprising phononic crystals can simultaneously provide a large Seebeck coefficient, high electrical conductivity, and low thermal conductivity.

For thermoelectric applications, the phononic bandgap of the phonon crystal is preferably located at the peak frequency of the black body phonon distribution, which varies with temperature. However, at any given temperature, the thermal phonon distribution spans an infinitely large frequency range. Therefore, although a larger portion of phonons are affected if the bandgap is nearer the blackbody peak, some phonons will be affected even if the gap is not located at the peak, resulting in alteration of the thermal properties of the thermoelectric material. As shown in Table 1, the location of the bandgap center frequency depends on the phononic crystal geometric parameters r, which is the radius of each scattering center, and a, which is the lattice constant or pitch of the scatterers in a 2D square lattice phononic crystal. At low temperatures/frequencies, i.e., below 0.5K/10 GHz, a phononic crystal can be formed using micromachining and optical lithographic techniques developed by the integrated circuits industry. See R. H. Olsson III, I. El-Kady and M. R. Tuck, *EUROSENSORS* 2008, pp. 3-8, September 2008, which is incorporated herein by reference. Utilizing advanced techniques, such as electron beam and focused ion beam lithography, nano-scale phononic crystals at temperatures/frequencies as high as 125K/2.5 THz can be fabricated. Phononic crystals centered at room temperature can be formed by techniques such as ion implantation, diffusion and self-assembly. See Stein et al., *Rev. Sci. Inst.* 75(4), 900 (2004); and Li et al., *Nature* 412, 166 (2001), which are incorporated herein by reference.

TABLE 1

Relationship of Location of Phononic Bandgap to Phononic Crystal Geometric Parameters

| Center Frequency | Scatterer Radius (r) | Lattice Pitch (a) | Phonon Temperature (T) |
|---|---|---|---|
| 50 MHz | 50 μm | 100 μm | 2.5 mK |
| 5 GHz | 0.5 μm | 1 μm | 0.25 K |
| 10 GHz | 250 nm | 500 nm | 0.5 K |
| 100 GHz | 25 nm | 50 nm | 5 K |
| 1 THz | 2.5 nm | 5 nm | 50 K |
| 2.5 THz | 1 nm | 2 nm | 125 K |

Reduction in Phonon Thermal Conductivity in Microporous Solids

As described above, the major challenge to increasing ZT is to minimize $\kappa_{ph}$. The present invention is directed to synthetic thermoelectric materials using phononic crystals to reduce $\kappa_{ph}$. To optimize the thermoelectric performance of a phononic crystal system, it is useful to first examine the phonon thermal conductivity of porous structures. Size effects are known to have significant impact on phonon thermal transport in micro and nanoscale systems. See D. G. Cahill et al., *Journal of Applied Physics* 93, 793 (2003). Understanding of such effects is crucial for the study of thermal transport in micro- and nanosystems and for continued development of novel applications, such as thermoelectrics. See A. I. Boukai et al., *Nature* 451, 168 (2008); G. Chen, *Journal of Heat Transfer* 119, 220 (1997); M. S. Dresselhaus et al., *Microscale Thermophysical Engineering* 3, 89 (1999); and S. Riffat and X. Ma, *Applied Thermal Engineering* 23, 913 (2003). In particular, porous structures are known have strong tunable size effects due to increased surface areas. See G. Benedetto et al., *Applied Physics A* 64, 155 (1997); and U. Bernini et al., *Applied Physics A* 81, 399 (2005). Whereas the electron thermal size effects have been observed on nanometer length scales in porous structures, phonon thermal size effects have been observed on micron length scales. See P. E. Hopkins et al., *Journal of Nanomaterials* 2008, pp. 418050, doi:10.1155/2008/418050 (2008); and D. Song and G. Chen, *Applied Physics Letters* 84, 687 (2004). This has substantial impact on phononic crystal structures, which can provide novel material solutions for thermoelectric applications. See R. H. Olsson III and I. El-Kady, *Measurement Science and Technology* 20, p. 012002 (2009). The origin of phonon size effects on the thermal conductivity reduction in periodic microporous silicon membranes is described below. As described below, a model for the thermal conductivity of microporous materials is first constructed based on phonon thermal transport, and this model is then compared to recent experimental findings by Song and Chen. See D. Song and G. Chen, *Applied Physics Letters* 84, 687 (2004). Using this model, the spectral contribution of the various phonon modes shows that the origin of the temperature dependency of the thermal conductivity reduction is attributed to low frequency phonon boundary scattering off the porous media boundaries.

To model the effects of porosity on the thermal conductivity, a procedure was used similar to that outlined by Holland to capture the effects of scattering on certain phonon frequencies and modes. See M. G. Holland, *Physical Review* 132, 2461 (1963). The thermal conductivity is given by $$\kappa = \frac{1}{6\pi} \sum_j \int_q \frac{\hbar^2 \omega_j^2(q)}{k_B T^2} \frac{\exp\left[\frac{\hbar \omega_j(q)}{k_B T}\right]}{\left(\exp\left[\frac{\hbar \omega_j(q)}{k_B T}\right] - 1\right)^2} v_j^2(q) \tau_j(q) q^2 \, dq \quad (1)$$

where $\hbar$ is the reduced Planck's constant, $\omega(q)$ is the phonon dispersion, $k_B$ is the Boltzmann constant, T is the temperature, $v(q)=\partial\omega(q)/\partial q$ is the phonon group velocity, $\tau(q)$ is the scattering time of the phonons, q is the wavevector, and the thermal conductivity, $\kappa$ is summed over j=3 modes (one longitudinal and two transverse). To evaluate this expression for silicon, for example, the Si dispersion and scattering times must be determined. Measured bulk Si dispersion data in the [1,0,0] direction was used and the data was fit to a $4^{th}$ degree polynomial for an analytical expression for $\omega(q)$ and $v(q)=\partial\omega(q)/\partial q$. See G. Nilsson and G. Nelin, *Physical Review B* 6, 3777 (1972); and B. N. Brockhouse, *Physical Review Letters* 2, 256 (1959). In bulk Si, phonon scattering is dominated by Umklapp, impurity, and boundary scattering, which are given by $\tau_{Umklapp,j}^{-1}=BT\omega_j^2(q)\exp[C/T]$, $\tau_{impurity,j}^{-1}=D\omega_j^4(q)$ and $\tau_{boundary,j}=v_j(q)/E$, respectively, where B, C, D, and E are constants determined by fitting Eq. (1) to data. See G. Chen, *Nanoscale Energy Transport and Conversion: A Parallel Treatment of Electrons, Molecules, Phonons, and Photons*, New York: Oxford University Press (2005). These scattering times are related to the total phonon scattering time in Eq. (1) via Mattheissen's Rule, $$\frac{1}{\tau_j(q)} = \frac{1}{\tau_{Umklapp,j}} + \frac{1}{\tau_{impurity,j}} + \frac{1}{\tau_{boundary,j}}. \quad (2)$$

Given Eq. (2) with Eq. (1), the thermal conductivity of Si can be calculated and the coefficients in the various scattering times can be iterated to achieve a best fit with measured data on bulk Si. See C. Y. Ho et al., *Journal of Physical and Chemical Reference Data* 1, 279 (1972). FIG. 1 shows the model fit to the data. The best fit coefficients for the various scattering times are B=3.73×10$^{-19}$ s K$^{-1}$, C=157.3 K, D=9.32×10$^{-45}$ s$^3$, and E=2.3×10$^{-3}$ m. The inset of FIG. 1 shows the measured dispersion of Si and the polynomial fit. The transverse branch is assumed to be doubly degenerate. See G. Nilsson and G. Nelin, *Physical Review B* 6, 3777 (1972); and B. N. Brockhouse, *Physical Review Letters* 2, 256 (1959). The 4$^{th}$ order polynomial fit has the form $\omega(q)=A_4q^4+A_3q^3+A_2q^2+A_1q$. For the longitudinal branch, the coefficients $A_4, A_3, A_2$, and $A_1$, are 1.37×10$^{-27}$ m$^4$ s$^{-1}$, −3.53×10$^{-17}$ m$^3$ s$^{-1}$, 2.94×10$^{-8}$ m$^2$ s$^{-1}$, and 8,350 m s$^{-1}$, respectively. For the transverse branch, the coefficients are 1.94×10$^{-27}$ m$^4$ s$^{-1}$, −3.36×10$^{-17}$ m$^3$ s$^{-1}$, 1.86×10$^{-7}$ m$^2$ s$^{-1}$, and 6,090 m s$^{-1}$, respectively. The boundary scattering determined from the fit in FIG. 1 does not represent internal boundaries, such as grain boundaries or nanomaterial boundaries, since Eq. (4) is used to fit Eq. (1) to bulk, single crystalline Si data. See A. D. McConnell and K. E. Goodson, *Annual Review of Heat Transfer* 14,129 (2005); A. D. McConnell et al., *Journal of Microelectromechanical Systems* 10, 360 (2001); P. E. Hopkins et al., *Journal of Nanomaterials* 2008, pp. 418050, doi: 10.1155/2008/418050 (2008); and P. E. Hopkins, *Journal of Applied Physics* 105, 093517 (2009).

With all the parameters determined for the thermal conductivity of solid single crystalline Si, $\kappa_{solid}$, the effects of periodic voids in the crystal can be considered. The first aspect of the phonon transport that must be considered is scattering off the edges of the voids in the porous structure. To model this, the scattering process can be treated like scattering from phonons at grain boundaries given by $\tau_{internal,j}^{-1}=v_j(q)/L$, where L is the distance between void boundaries. See A. D. McConnell et al., *Journal of Microelectromechanical Systems* 10, 360 (2001). Two distances are considered to match the Si microporous membranes that have been previously experimentally studied, L=9.1 and 1.7 μm. See D. Song and G. Chen, *Applied Physics Letters* 84, 687 (2004). The dominant thermal wavelength of Si at 40 K is estimated as 1.25 nm assuming $\lambda_{thermal} \approx hv_{avg}/(k_BT)$ where v is the average phonon velocity, which is taken as 6,545 m s$^{-1}$, justifying the use of a bulk dispersion relation of Si since the distance between the periodic voids that are considered is nearly three orders of magnitude greater than the thermal wavelength. See D. E. Gray, *American Institute of Physics Handbook*, 3$^{rd}$ ed. New York: McGraw Hill (1972).

Figure 2:
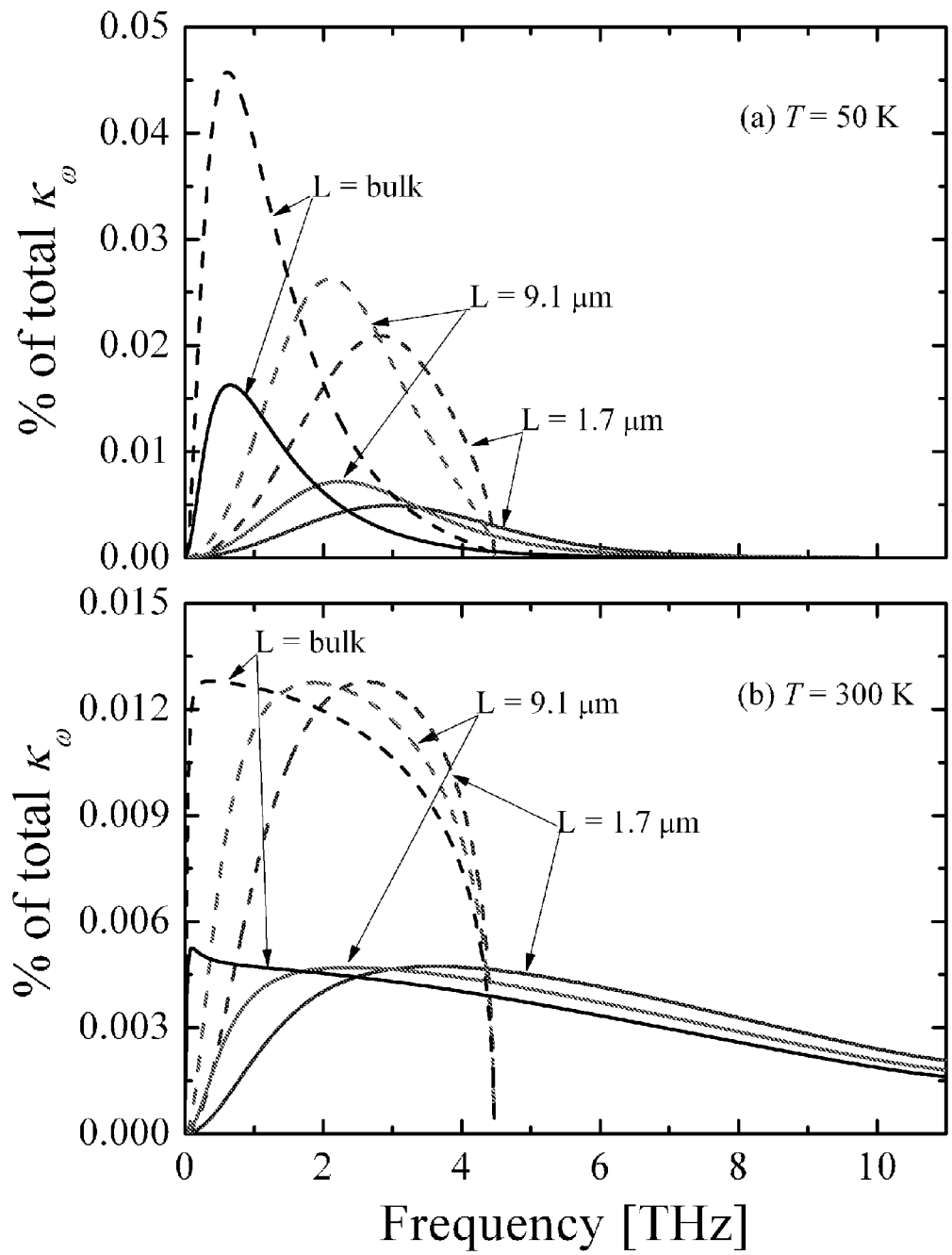
FIG. 2 is a graph of the fraction of the total spectral thermal conductivity at (a) 50 and (b) 300 K for L=∞(no void boundaries), 9.1, and 1.7 μm, where L is the distance between void boundaries. The longitudinal components are shown by the solid lines and the transverse components by the dashed lines.

To understand how the thermal conductivity of the Si crystal is affected by boundary scattering at these distances, the spectral contribution to thermal conductivity is analyzed, given by $$\kappa_{\omega,j} = \frac{1}{6\pi} \frac{\hbar^2 \omega_j^2(q)}{k_B T^2} \frac{\exp\left[\frac{\hbar \omega_j(q)}{k_B T}\right]}{\left(\exp\left[\frac{\hbar \omega_j(q)}{k_B T}\right]-1\right)^2} v_j(q)\tau_j(q)q^2, \quad (3)$$

where the transverse spectral thermal conductivity is multiplied by 2 since doubly degenerate transverse branches are assumed. FIG. 2 shows the fraction of the total spectral thermal conductivity at (a) 50 and (b) 300 K for L=∞ (no void boundaries), 9.1, and 1.7 μm. This fraction is defined as $$\kappa_{\omega,j} \bigg/ \sum_j \sum_\omega \kappa_{\omega,j}.$$

The longitudinal components are shown by the solid lines and the transverse components by the dashed lines. As the scattering distance decreases, the dominant phonon frequencies participating in transport increase. This means that the low frequency (long wavelength) phonons are being scattered or "impeded" most drastically. This also explains the significant thermal conductivity reduction with decreasing temperature. At low temperatures, (FIG. 2(*a*), T=50 K), the dominant phonon frequencies responsible for heat transport are relatively low. Thus, introducing periodic boundaries (producing features of micron dimensions) has significant impact on the phonons participating in transport. As temperatures increase (FIG. 2(*b*), T=300 K), the dominant phonon frequencies increase, and scattering of the low frequency phonons (most strongly impacted by the microporous structure) does not affect the thermal conductivity as drastically.

Figure 3:
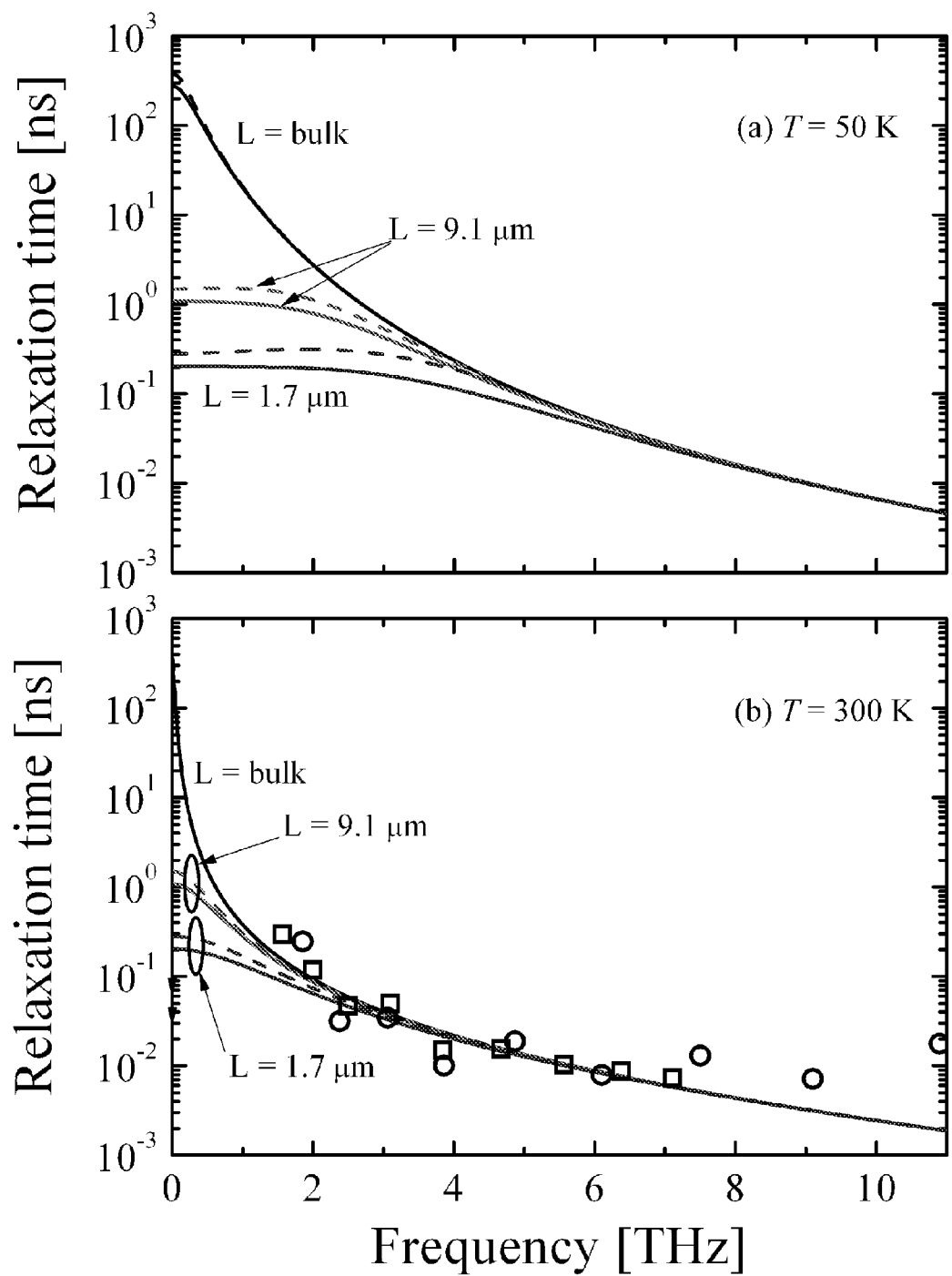
FIG. 3 is a graph of the relaxation time of the longitudinal (solid lines) and transverse (dashed lines) as a function of frequency for (a) T=50 K and (b) T=300 K. For comparison, relaxation times calculated with molecular dynamics simulations for bulk Si at 300 K are shown. The circles represent the longitudinal modes and the squares the transverse modes.

To understand this in more detail, FIG. 3 shows the relaxation time as a function of frequency for the cases considered in FIG. 2. The solid lines represent the longitudinal modes and the dashed lines the transverse modes. The relaxation time decreases as the boundary length decreases, but the relaxation times of all three cases converge at higher frequencies. The relaxation time is directly related to the mean free path. The lower frequency phonons with larger mean free paths are scattered more readily at the pore boundaries than the higher frequency phonons which have smaller mean free paths. Since these low frequency phonons are scattered more readily, the spectral contribution of thermal conductivity is dominated by higher frequency phonons as the boundary scattering distance decreases, as predicted by FIG. 2. Also, as temperature decreases, the relaxation time does not decrease as rapidly as a function of frequency, leading to a larger mean free path of phonons at higher frequencies. This causes scattering of higher frequency phonons at lower temperatures leading to a further decrease in thermal conductivity. The frequency dependent relaxation time calculated on bulk Si using molecular dynamics (MD) simulations by Henry and Chen are shown for comparison. See A. S. Henry and G. Chen, *Computational and Theoretical Nanoscience* 5, 1 (2008). The MD simulations agree well with the calculated values and trends of bulk Si relaxation time. The deviation at high frequencies in the longitudinal modes does not affect the thermal conductivity calculations since high frequency longitudinal modes do not significantly contribute to thermal conductivity at room temperature as seen in FIG. 2*b*; the contribution of longitudinal phonons above 9.0 THz was calculated to contribute less than 4% to the overall thermal conductivity.

Further reductions in $\kappa_{solid}$ must be accounted for by the porous nature of the structure, as less silicon is present in the porous structure than in its unpatterned counterpart. To account for this reduction in material, two simplified models based on Fourier heat conduction theory were used. The "R" model, derived by Russell, is given by $\kappa_{porous}/\kappa_{solid}=(1-\phi^{2/3})/(1-\phi^{2/3}+\phi)$ where $\phi$ is the porosity. See H. W. Russell, *Journal of the American Ceramic Society* 18, 1 (1935).

Figure 4:
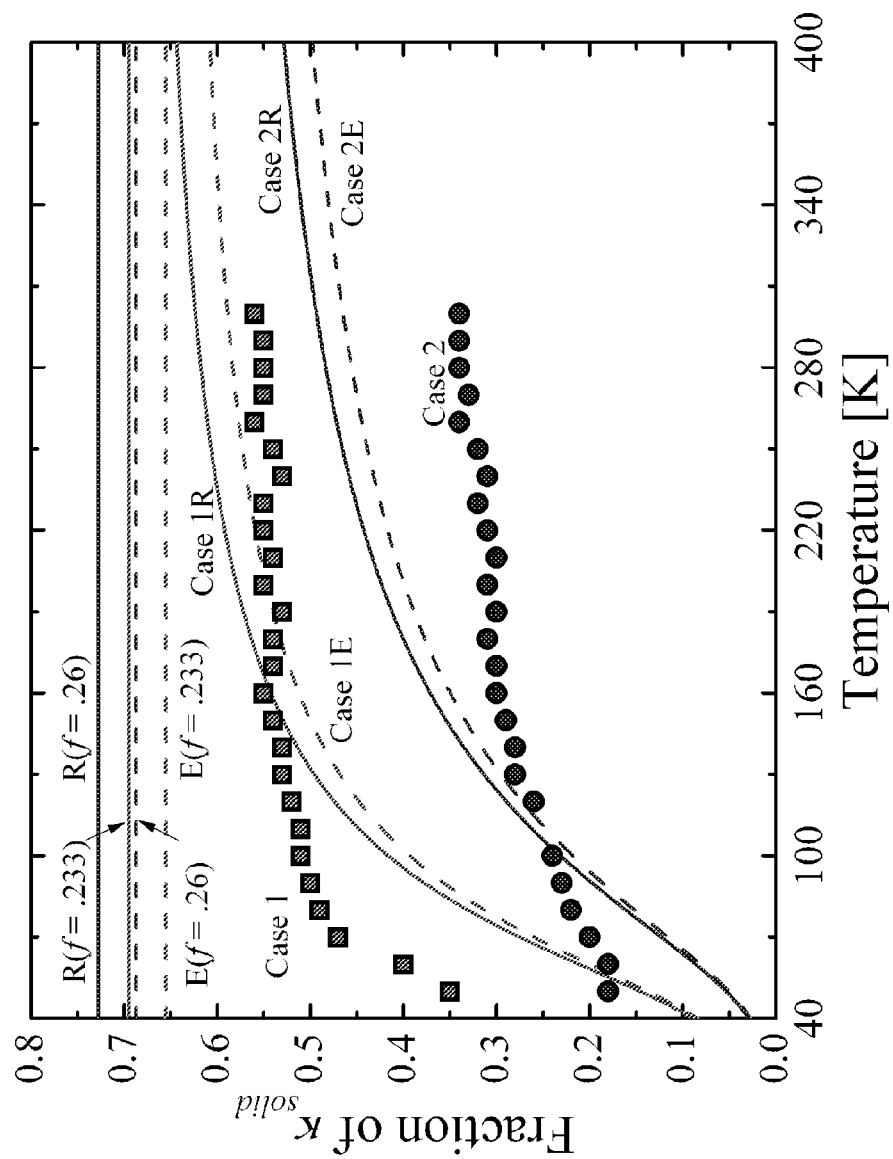
FIG. 4 is a graph of the calculated thermal conductivity accounting for pore boundary scattering for two porous Si structures. The L=9.1 μm (Case 1) structure has a porosity of 23.3% and the L=1.7 μm (Case 2) structure has a porosity of 26%. The data collected by Song and Chen are shown in this figure along with the reduction in thermal conductivity predicted by the R (solid lines) and E (dashed lines) models without assuming boundary scattering.

The "E" model, derived by Eucken, is given by $\kappa_{porous}/\kappa_{solid}=(1-\phi)/(1+\phi/2)$. See A. Eucken, *Forsch. Ceram. Abstr.* 12, 231 (1933). FIG. 4 shows the calculated thermal conductivity accounting for pore boundary scattering for two porous Si structures studied by Song and Chen. See D. Song and G. Chen, *Applied Physics Letters* 84, 687 (2004). The L=9.1 µm (Case 1) structure has a porosity of 23.3% and the L=1.7 µm (Case 2) structure has a porosity of 26%. The data collected by Song and Chen are also shown in this figure along with the reduction in thermal conductivity predicted by the R and E models without assuming boundary scattering. The scattering of phonons off the pore boundaries explains the temperature trend in the reduction in thermal conductivity of the two microporous Si structures. The porosity alone explains some of the reduction, but does not capture the full reduction or the temperature trend in the thermal conductivity reduction.

In conclusion, by analyzing the spectral contribution of phonons to thermal conductivity and the dependence on relaxation time with phonon frequency, the majority of the reduction in thermal conductivity of porous materials can be associated with low frequency phonon scattering off the pore boundaries, which also explains the temperature trends in $\kappa_{porous}/\kappa_{solid}$ observed in recent data on porous Si structures. Further reduction in thermal conductivity is ascribed to the porous nature of the solid.

Reduction in Thermal Conductivity of Single Crystal Si by Phononic Crystal Patterning Silicon is at the heart of almost all hi-tech devices and applications. It is arguably the seed of the semiconductor revolution. One of the fundamental tenets for silicon electronics is controlling the heat flow that is a byproduct of the nature of electronic operations. While ultra-low thermal conductivity has been observed in silicon nanowires and nanomeshes, the fundamental barriers remain against the practical implementation of such ultra-small devices. A phononic crystal geometry in silicon can provide nearly the same order of magnitude of thermal conductivity reduction as silicon nanowires while maintaining the characteristic length scales at an order of magnitude larger. Since phononic crystals can be mass produced and are compatible with standard CMOS fabrication, this enables the practical implementation of such devices. An added bonus of this approach comes to light by realizing that the electron mean free path is an order of magnitude smaller than that of the phonons involved, thereby laying the foundation for the realization of exceptionally high ZT in silicon and other Phononic crystal amenable material systems.

As described above, material systems with structural length scales on the order of nanometers have unique abilities to control thermal transport. Internal interfaces and boundaries in nanosystems create thermal carrier scattering events, and tailoring the period or structure of these boundaries offers a unique method for tuning their thermal properties. While this aspect of reducing the thermal conductivity alone has resulted in ultra-low thermal conductivity of fully-dense materials which proves useful for thermal barrier applications, this "boundary engineering" has also proven successful in designing nanocomposites for thermoelectric applications. See C. Chiritescu et al., *Science* 315, 351 (2007); R. M. Costescu et al., *Science* 303, 989 (2004); N. P. Padture et al., *Science* 296, 280 (2002); and R. Venkatasubramanian et al., *Nature* 413, 597 (2001). As described above, the efficiency of material systems for thermoelectric applications can be quantified with the well-known non-dimensional thermoelectric figure of merit, ZT. Therefore, introducing interfaces and boundaries at length scales that will scatter phonons more frequently than electrons will reduce the thermal conductivity more than the electrical conductivity, thereby increasing ZT.

This approach of nanoengineering material boundaries has been useful in decreasing the thermal conductivity of single crystalline silicon. Silicon nanowires have shown particular promise for low thermal conductivity applications through further reduction of nanowire diameter and increased surface roughness. See A. I. Hochbaum et al., *Nature* 451, 163 (2008); A. I. Boukai et al., *Nature* 451, 168 (2008); D. Li et al., *Applied Physics Letters* 83, 2934 (2003); and R. Chen et al., *Physical Review Letters* 101, 105501 (2008). However, structural stability and large contact areas are necessary criteria for most applications, and individual nanowires lack both of these characteristics. Increasing the surface area of nanowires causes the nanowires to lose their unique thermal properties, and creating large arrays of nanowires with appropriate lengths creates difficulties in nanowire alignment and integrity. Therefore, a new parameter is used herein to evaluate the applicability of low thermal conductivity materials, based on the usable area of the material of interest. This parameter, the thermal conductivity of a "unit cell" of a material, is given by $\kappa_{uc}=\kappa_m/A_{uc}$, where $\kappa_m$ is the measured thermal conductivity of the nanosystem and $A_{uc}$ is the cross sectional area of the solid matrix of the unit cell. Ideally, $A_{uc}$ should be as large as possible so that $\kappa_{uc}$ is minimized for low thermal conductivity applications.

As described above, phononic crystals comprise a periodic arrangement of scattering centers embedded in a homogeneous background matrix with a large contrast in elastic properties. Phonons propagating in such structures undergo two distinct types of scattering mechanisms: (1) coherent or harmonic scattering brought about by Bragg and Mie scattering events which result primarily in the creation of phononic gaps where the propagation of phonons are prohibited, and (2) incoherent or anharmonic scattering arising as a consequence of the large acoustic impedance mismatch between the host background matrix and the scattering centers, though the interference is not coherent. The combination of these two phenomena results in a rich complicated band structure (dispersion) compared to that of the bulk solid in absence of phononic crystal structuring accompanied by a redistribution of the phononic density of states (DOS). The result is the creation of a number of unusual phenomena absent from the bulk case, namely: (1) Anomalous dispersion bands that are characterized by possessing a slope that is smaller than that of the corresponding bulk states. Since the speed with which phonons conduct heat is determined by the group velocity, which is in turn determined by the slope of the dispersion curves, this phenomena leads to a reduction in the rate with which heat is conducted through the structure and hence ultimately to a reduction in the thermal conductivity. (2) Flat dispersion-less bands that are characterized by an anomalously high phononic DOS and a vanishing phonon group velocity. This in turn implies that a large fraction of the phonons that participated in thermal conductivity will now be almost stationary and hence have a negligible contribution to the thermal conductivity. (3) Negative group velocity that occurs in bands that now have a negative slope as compared to bulk dispersion. Again, since the group velocity is proportional to the slope of the dispersion curve, this yields a negative value for the group velocity of phonons belonging to these bands. This can be simplistically understood as being the phonon analogue of back-scattering. Phonons belonging to these states would then act to reduce the thermal conductivity.

Figure 5:
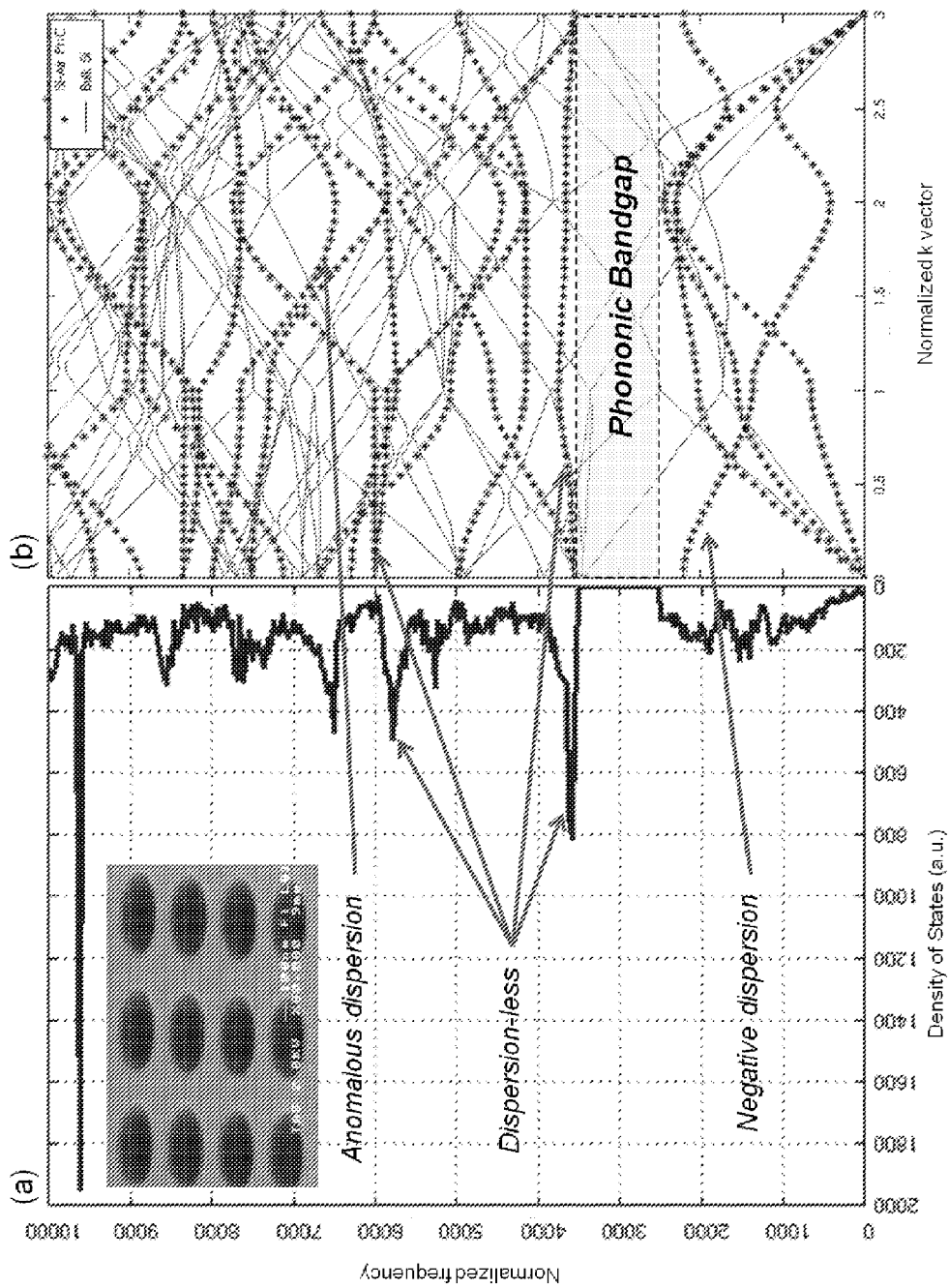
FIG. 5(a) is a graph of the phononic density of states (DOS) and FIG. 6(b) is the corresponding dispersion (band structure) for a Si—PnC (dotted lines) with a lattice constant of 2.5 μm, and a minimum feature size of 500 nm as compared to bulk dispersion (solid lines). Inset is an SEM image of the fabricated and tested device. Different types of unusual dispersion bands are pointed out.

FIG. 5 shows the computed band structure for a Si—PnC with the various types of bands described above. FIG. 5(a) is a graph of the density of phonon states (DOS) and FIG. 5(b) is the corresponding dispersion (band structure) for a Si—PnC (dotted lines) with a lattice constant of 2.5 µm, and a minimum feature size of 500 nm as compared to dispersion of bulk silicon (solid lines). Inset is an SEM image of the fabricated and tested Si PnC. The different types of unusual dispersion bands are pointed out.

To validate the above arguments, the thermal conductivity of single crystalline silicon phononic crystals with a thickness of 500 nm, pore spacings of several hundreds of nanometers, and areal footprints of 20,000 µm² were examined. The fabrication of the exemplary silicon phononic crystal began with 150 mm silicon-on-insulator (SOI) wafers, where the buried oxide (BOX) layer was 3 µm thick. The <100>, n-type, top Si layer where the phononic crystal devices was realized was 500 nm thick and had a resistivity of 37.5-62.5 Ω-cm. The phononic crystals were formed by etching circular air holes of diameter d=300-400 nm in the top Si, arranged in a simple cubic lattice, with center-to-center hole spacings, a, of 500, 600, 700 and 800 nm. Specifically, the samples had d/a=300/500 nm (3/5), 300/600 nm (3/6), 400/700 nm (4/7) and 400/800 nm (4/8). Release areas were also etched in the top Si to the BOX, and the membranes were suspended above the substrate by removing the BOX in vapor phase hydrofluoric acid (VHF).

Figure 6:
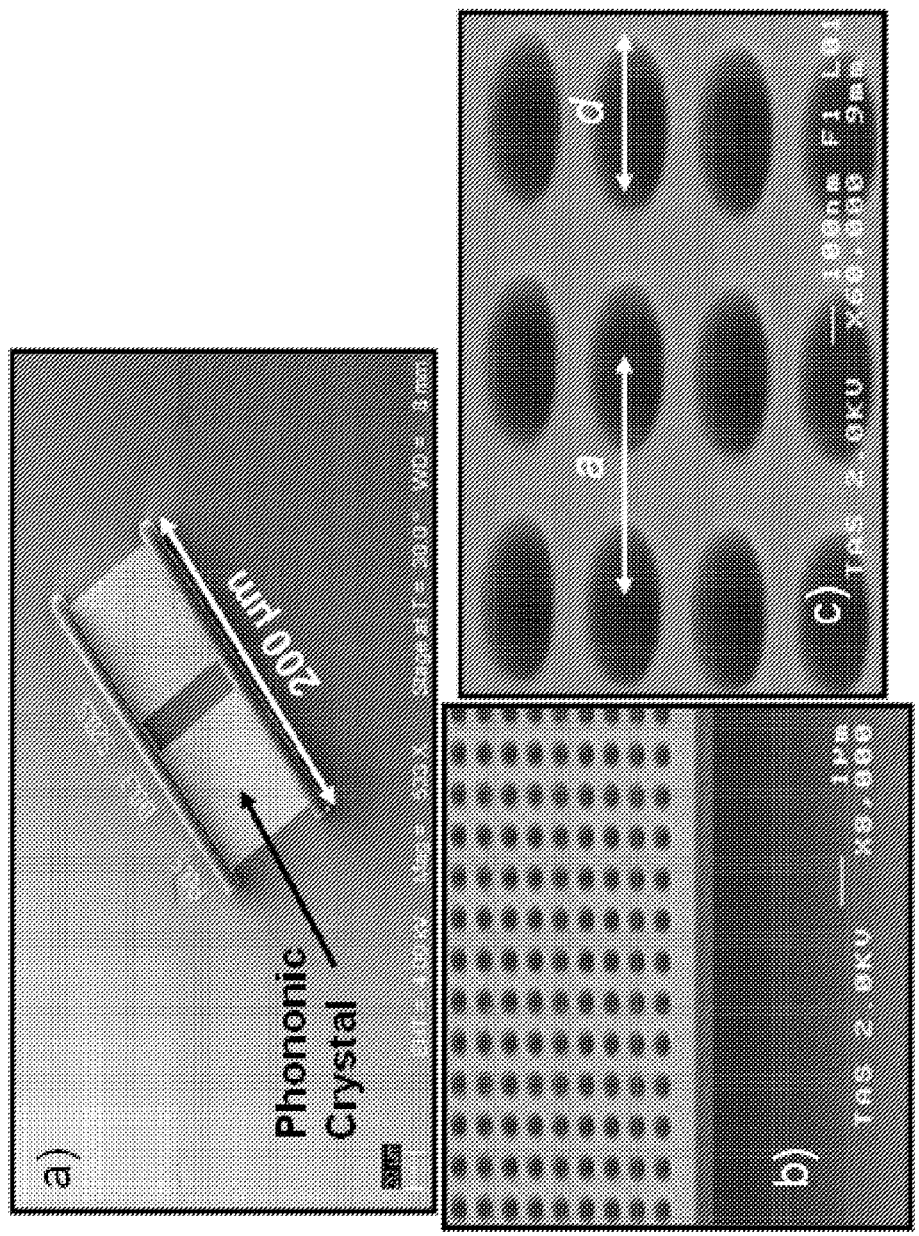
FIG. 6(a) is a top down image of a membrane containing two phononic crystals with a=500 nm and d=300 nm. The membrane is 60 μm wide and 200 μm long. A 20.5 μm wide area between the phononic crystals is located in the center of the membrane for the pump probe measurement. The length of each phononic crystal is 80 μm for a total of 160 periods.
FIG. 6(c) is a close in image of a Si/air PnC showing the lattice constant, a, and hole diameter, d.

FIG. 6(a) shows a top-down image of a membrane containing two phononic crystals with a=500 nm and d=300 nm. The membrane is 60 wide and 200 µm long. A 20.5 µm wide area between the phononic crystals is located in the center of the membrane for the pump-probe measurement. The length of each phononic crystal is 80 µm for a total of 160 periods when a=500 nm. The 600, 700 and 800 nm lattice constant devices have the same membrane width, length and spacing between the phononic crystals and contain 133, 115 and 101 phononic crystal periods respectively, maintaining a nearly constant phononic crystal length of 80 µm for each sample. FIG. 6(b) shows a side image of a phononic crystal membrane and its suspension above the substrate to isolate thermal effects in the membrane. FIG. 6(c) shows a close-in image of a Si/air PnC.

The thermal conductivity of the phononic crystals was measured with the time-domain thermoreflectance technique (TDTR). See P. M. Norris et al., *Review of Scientific Instruments* 74, 400 (2003); and C. A. Paddock and G. L. Eesley, *Journal of Applied Physics* 60, 285 (1986). The specific experimental setup is described in detail in P. E. Hopkins et al., *Journal of Heat Transfer* 132, 081302 (2010). TDTR is a noncontact, pump-probe technique in which a modulated train of short laser pulses (in our case ~100 fs) is used to create a heating event ("pump") on the surface of a sample. This pump-heating event is then monitored with a time-delayed probe pulse. The change in the reflectivity of the probe pulses at the modulation frequency of the pump train is detected through a lock-in amplifier; this change in reflectivity is related to the temperature change on the surface of the sample. This temporal temperature data is related to the thermophysical properties of the sample of interest. In practice, a thin metal film is deposited on the sample of interest which acts as a thermometer that absorbs the pump energy in less than 15 nm below the surface. In the present example, 100 nm of Al was sputtered on the surface of the phononic crystals. The thermoreflectance signal was monitored over 4.0 ns of probe delay time. The deposited energy took ~100 ps to propagate through the Al layer, and the remaining 3.9 ns of delay time were related to the heat flow across the Al/PnC interface and through the phononic crystal.

The thermoreflectance signal monitored was the ratio of the in-phase to the out-of-phase voltage recorded by the lock-in amplifier. The ratio is related to the temperature change by $$\text{ratio} = -\frac{\text{Re}\left[\sum_{M=-\infty}^{\infty} \Delta T(\omega_0 + M\omega_L)\exp[iM\omega_L\tau]\right]}{\text{Im}\left[\sum_{M=-\infty}^{\infty} \Delta T(\omega_0 + M\omega_L)\exp[iM\omega_L\tau]\right]}, \quad (4)$$

where $\Delta T$ is the temperature rise on the sample surface, $\omega_0$ is the pump modulation frequency, $\omega_L$ is the modulation frequency of the laser source, and r is the pump-probe delay time. The Ti:Sapphire oscillator used had a nominal repetition rate of 80 MHz. The thermal model and analysis used to predict $\Delta T$ is described in detail in D. G. Cahill, *Review of Scientific Instruments* 75, 5119 (2004); and A. J. Schmidt et al., *Review of Scientific Instruments* 79, 114902 (2008). In short, the thermal model accounts for heat transfer in composite slabs from a periodic, Gaussian source (pump) convoluted with a Gaussian sampling spot (probe). See H. S. Carslaw and J. C. Jaeger, "Section 10.4.VI. The periodic point source, p. 263," in *Conduction of Heat in Solids, $2^{nd}$* (2003) Ed. New York: Oxford University Press, p. 263 (1959); and D. G. Cahill, *Review of Scientific Instruments* 75, 5119 (2004). In these experiments, the pump modulation frequency was 11 MHz and the pump and probe spot sizes were 15 µm. The temperature change at the surface is related to the thermal conductivity, κ, and heat capacity, C, of the composite slabs and the thermal boundary conductance, $h_K$, between each slab at a distance of $\delta=\sqrt{2\kappa/(C\omega_0)}$ underneath the surface, where $\delta$ is the thermal penetration depth from the modulated pump train.

As $h_K$ is highly dependent on the structure and material composition around the interface, for any given material system $h_K$ can change from sample to sample. See E. T. Swartz and R. O. Pohl, *Applied Physics Letters* 51, 2200 (1987); P. E. Hopkins and P. M. Norris, *Applied Physics Letters* 89, 131909 (2006); and P. E. Hopkins et al., *Journal of Heat Transfer* 130, 062402 (2008). Therefore, 100 nm of Al was deposited on the entire wafer including both the phononic crystal structures and the areas without the phononic crystals. This allowed for independent measurement $h_K$ with TDTR at the deposited Al/Si interface without any complication from the phononic crystal structure. $h_K$ was measured at the Al/Si material interfaces as 170±20 MW m$^{-2}$ K$^{-1}$. TDTR data was then collected on the four different phononic crystal structures (3/5, 3/6, 4/7 and 4/8) at room temperature. The temporal decay of the thermoreflectance signal (which is related to the temperature change) was much different than that of the Si film used for $h_K$ calibration. A more shallow decay in the thermoreflectance signal represents a longer thermal time constant, which implies a reduction in the thermal diffusivity. This qualitatively shows the change in the thermal diffusivity of the phononic crystal structures compared to the unpatterned Si thin film. To quantify this, the reduction in C and $h_K$ due to surface porosity of the Al-coated phononic crystal structure was accounted for by multiplying the bulk values of C in the Al film and Si PnC and $h_K$ at the Al/Si PnC interface by a factor of (1−φ) where φ is the porosity; this effectively treats the air in the phononic crystal as nonabsorbing so that the best fit thermal conductivities represent the thermal transport through only the solid matrix of the phononic crystal. The bulk values of C were taken from the literature and the "non-porous" $h_K$ value taken from the previous measurement at the Al/Si interface in the non-PnC fabrication locations on the wafer. See F. Incropera and D. P. DeWitt, *Fundamentals of Heat and Mass Transfer*, 4th ed. New York: Wiley and Sons, Inc., (1996). The porosities of the 3/5, 3/6, 4/7 and 4/8 structures were calculated based on the geometry of each structure, and were $\phi$=0.28, 0.19, 0.25 and 0.19, respectively. The measured thermal conductivities on the (3/5), (3/6), (4/7) and (4/8) phononic crystal structures were 5.84±1.3, 4.81±1.0, 7.11±1.8 and 6.58±0.5 W m$^{-1}$ K$^{-1}$, where the uncertainty represents the standard deviation among the best fit to 3 different data sets taken on three different samples with similar geometries (9 data sets total).

Figure 7:
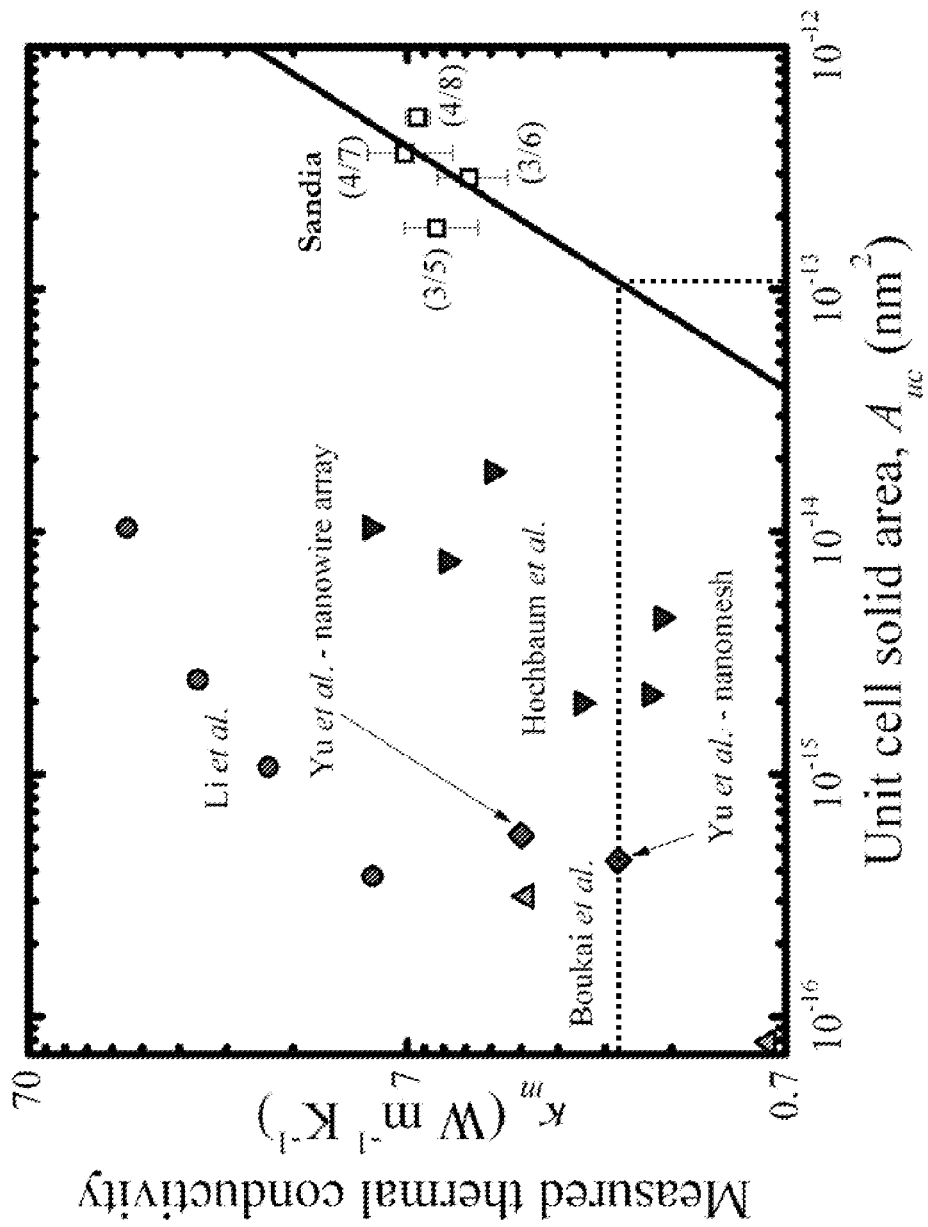
FIG. 7 is a graph of the measured thermal conductivity as a function of unit cell solid area. The four phononic crystals are depicted by the unfilled squares and the Si nanowires by the downward triangles (Hochbaum et al.), upward triangles (Boukai et al.), and circles (Li et al.). The recent nanowire arrays and nanomesh data are depicted by the diamonds (Yu et al.). All data shown in this figure are for room temperature measurements except for the nanomesh data which was taken at 280 K. The solid lines represent $\kappa = \kappa_{uc\_PnC\_avg} A_{uc} = \kappa_{m\_PnC\_avg} A_{uc}/A_{uc\_PnC\_avg}$, where $\kappa_{m\_PnC\_avg}$ and $A_{uc\_PnC\_avg}$ were calculated by averaging values from the phononic crystals ($\kappa_{m\_PnC\_avg}$=6.09 W m$^{-1}$ K$^{-1}$ and $A_{uc\_PnC\_avg}$=0.337 μm$^{-2}$).

FIG. 7 shows the measured thermal conductivity of the four phononic crystals as a function of unit cell area along with the measured thermal conductivity of the various Si nanostructures from previous studies. For the unit cell area of the phononic crystals, the area of the air holes was subtracted to include only the unit cell of the solid fraction of the phononic crystal. The thermal conductivities of the phononic crystal structures show a drastic reduction from that of bulk, single crystalline Si (148 W m$^{-1}$ K$^{-1}$). See F. Incropera and D. P. DeWitt, *Fundamentals of Heat and Mass Transfer*, 4th ed. New York: Wiley and Sons, Inc., (1996). Although the nanowires and nanomesh data show similar, if not greater reduction, the phononic crystals have a much greater (1-3 orders of magnitude) unit cell solid area than the nanowires for the same thermal conductivity. To directly compare the phononic crystals to the nanowire data, consider $\kappa_{uc}$ on the phononic crystals extended to lower dimensions. The solid line in FIG. 7 represents $\kappa = \kappa_{uc\_PnC\_avg} A_{uc} = \kappa_{m\_PnC\_avg} A_{uc} / A_{uc\_PnC\_avg}$, where $\kappa_{m\_PnC\_avg}$ and $A_{uc\_PnC\_avg}$ were calculated by averaging values from the phononic crystals. This effectively projects the "device applicability" of the phononic crystals to lower unit cell areas. As apparent from FIG. 7, $\kappa_{uc}$ of the phononic crystals is the lowest $\kappa_{uc}$ of any silicon nanostructured material ($A_{uc}$<10$^{-12}$ m).

As described above with respect to microporous solids, to understand the origin of this thermal conductivity reduction at room temperature, a Callaway-Holland-type model can be used given by $$\kappa = \frac{1}{6\pi^2} \sum_j \int_q C_j(q) v_j^2(q) \tau_j(q) dq, \quad (5)$$

where $C_j$ is the specific heat per normal mode at frequency $\omega(q)$, $v_j$ is the phonon velocity, $\tau_j$ is the scattering time, and q is the wavevector. See J. Callaway, *Physical Review* 113, 1046 (1959); and M. G. Holland, *Physical Review* 132, 2461 (1963). In bulk Si, the scattering time around room temperature is dominated by Umklapp processes, with a relatively small contribution from impurity scattering. From Matthiessen's Rule, the scattering time is given by $\tau_j(q)=(\tau_{U,j}^{-1}(q)+\tau_{I,j}^{-1}(q))^{-1}$, where the Umklapp scattering rate is given by $\tau_{U,j}^{-1}(q)=AT\omega^2(q)\exp[-B/T]$, where T is the temperature and A and B are coefficients to be determined, and the impurity scattering rate is given by $\tau_{I,j}^{-1}(q)=D\omega^4(q)$, where D=1.32× 10$^{-45}$ s$^3$. See M. G. Holland, *Physical Review* 132, 2461 (1963). Eq. (5) was fit to the measured thermal conductivity of bulk Si, iterating A and B in the Umklapp scattering rate to achieve a best fit. See C. Y. Ho et al., *Journal of Physical and Chemical Reference Data* 1, 279 (1972). From this, it was determine that A=1.4×10$^{-19}$ s K$^{-1}$ and B=152 K. For these calculations, the dispersion of bulk Si by fitting a 4th degree polynomial to the dispersion calculated by Weber was obtained. See W. Weber, *Physical Review B* 15, 4789 (1977). After determining the Umklapp scattering rate in Si, a boundary scattering term was introduced via Matthiessen's rule to account for phonon scattering at the PnC-pore boundaries given by $\tau_{B,j}^{-1}(q)=L/v_j(q)$, where L is the average distance between pore-boundaries. As described above, this approach for modeling the reduction in thermal conductivity due to boundary scattering has proven successful in predicting the thermal conductivity of microporous, polycrystalline, and nanowire silicon samples. For the phononic crystals of interest in this exemplary study, the pore-edge to pore-edge distance was 200, 300, 300, and 400 nm for the (3/5), (3/6), (4/7), and (4/8) structures, respectively.

The thermal conductivity at room temperature as a function of L calculated via Eq. (5) is shown as the solid line in FIG. 8. Ultimately, the thermal conductivity of the solid matrix in the phononic crystal is of interest, not the reduction due to the removal of the material to create the phononic crystal. To directly compare the thermal conductivity reduction of the solid material in the phononic crystal to the reduction predicted from boundary scattering via Eq. (5), the expression derived by Eucken for the thermal conductivity of cylindrical porous solids was used. See A. Eucken, *Forschung auf dem Gebiete des lngenieurwesens*, vol. Ausgabe B, p. 3/4 VDI Forschungsheft 353 (1932). Following Eucken, the predicted thermal conductivity of the phononic crystals using Eq. (5) is related to the thermal conductivity of the solid matrix in the phononic crystal through $\kappa_s=\kappa_m(1+2\phi/3)/(1-\phi)$. Although more rigorous treatments of porosity have been derived for nanoporous solids, due to the large pore separation in our phononic crystals and relatively large porosities, it is expected that the majority of the phonon modes will be scattered diffusively at the pore boundaries (i.e., the ballistic character of phonon transport and its interaction with the pore edges is not important) and therefore the classical Eucken treatment should hold. See R. Prasher, *Journal of Applied Physics* 100, 034307 (2006); R. Prasher, *Journal of Applied Physics* 100, 064302 (2006); and J.-H. Lee et al., *Applied Physics Letters* 91, 223110 (2007).

Figure 8:
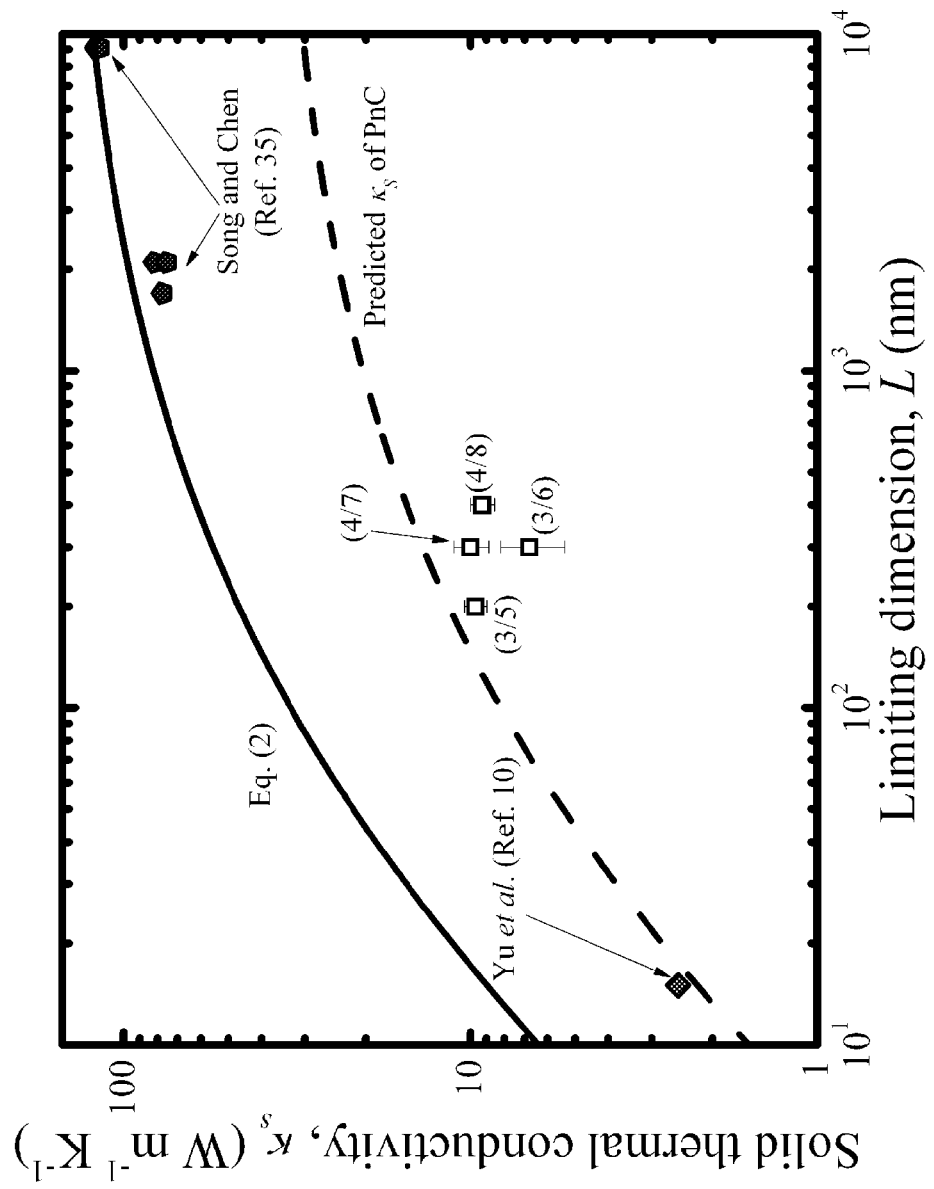
FIG. 8 is a graph of the thermal conductivity of Si structures at room temperature as a function of L for the phononic crystals (unfilled squares), microporous solids (filled pentagons), and nanomesh (filled diamond). The measured thermal conductivities are multiplied by a factor of $[(1+2\phi/3)/(1-\phi)]$ to account for the porosity of the structures, and thereby directly compare the thermal conductivity of the solid matrix in the porous structures to the model in Eq. (5). The solid line represents predictions of Eq. (5) at room temperature as a function of L. The dashed line represents predictions of the phononic crystal thermal conductivity, based on Eq. (5) with DOS calculations using the PWE method.

The thermal conductivities of the phononic crystals shown in FIG. 8 as a function of pore-edge separation are the values from FIG. 7 multiplied by the Eucken factor, where the porosities of the phononic crystals are 0.28, 0.20, 0.26 and 0.20 for the (3/5), (3/6), (4/7) and (4/8) structures, respectively. For comparison, the measured thermal conductivity of the Si microporous solids measured by Song and Chen are included and the nanomesh sample by Yu et al., also multiplied by their appropriate Eucken factors. See D. Song and G. Chen, *Applied Physics Letters* 84, 687 (2004); and J.-K. Yu et al., *Nature Nanotechnology*, Advanced Online Publication, http://www.nature.com/doifinder/10.1038/nnano.2010.149, (2010). Equation (5) predicts the thermal conductivity of the microporous solids measured by Song and Chen well; however, this model overpredicts the measured phononic crystal data by a factor of 5-7 and the data by Yu et al. by a factor of 4. The order of magnitude reduction in the phononic crystal thermal conductivity compared to Eq. (5) can be ascribed to the phononic crystal periodically porous structure changing the Si mode density. This shift in mode density can lead to a reduction in thermal conductivity.

Figure 9:
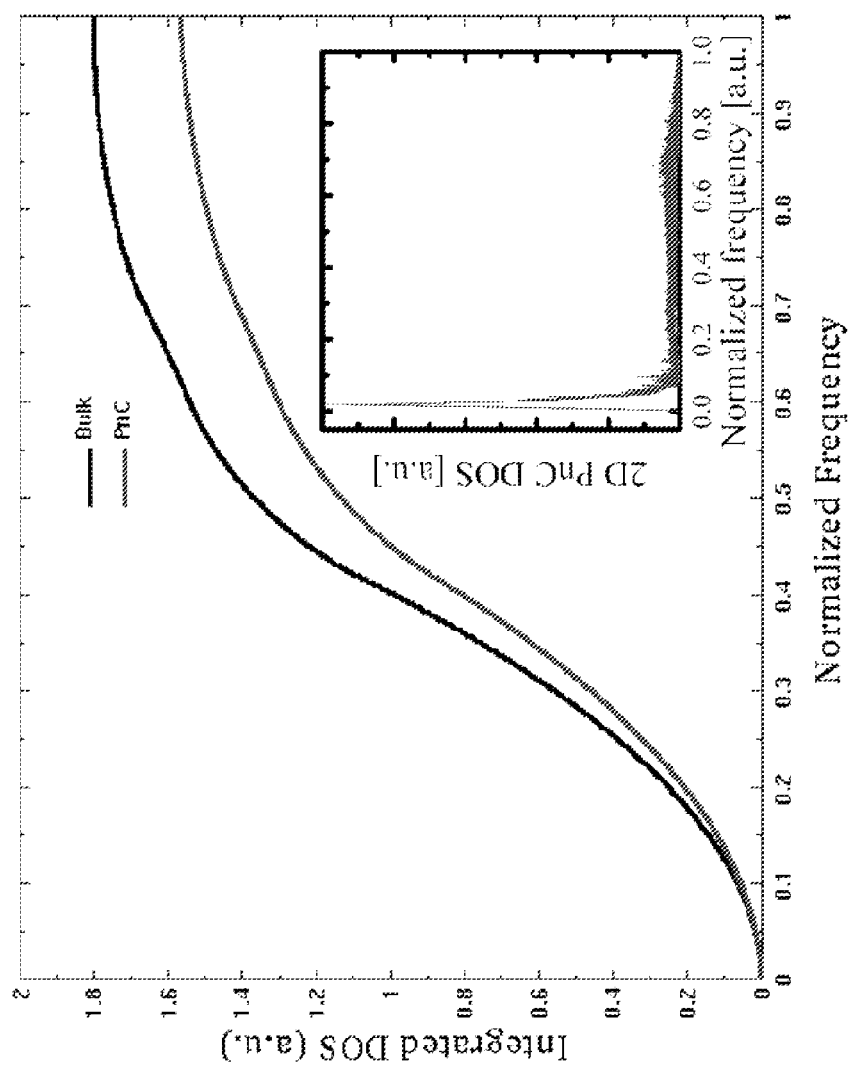
FIG. 9 is a graph of the integrated density of states as a function of frequency for bulk Si and phononic crystal lattice with d/a=0.6.

To investigate this effect further, the plane-wave expansion (PWE) technique of Kushwaha was used to calculate the phononic density of states (DOS) of the phononic crystal from its dispersion, and this data was used to calculate the change in thermal conductivity of the phononic crystal as compared to bulk (i.e. unpatterned) Si. See M. S. Kushwaha et al., *Physical Review B* 49, 2313 (1994). The PWE model is solved for the eigenmodes of an infinite 2D phononic crystal structure. Such a model accurately matches the behavior of the experimental measurements, since the thermal waves excited by the modulated pump propagate only a very short depth into the phononic crystal slab due to the high repetition rate (11 MHz) used in the TDTR experiments and thus do not "see" the finite thickness of the sample. The DOS of a given structure is calculated by numerically integrating the number of modes with respect to frequency for all directions in the first 2D Brillouin zone. FIG. 9 shows the integrated density of states as a function of frequency for bulk Si and a phononic crystal with d/a=0.6 (the bulk dispersion was calculated using the same material parameters as the phononic crystal but with d/a=0). The inset shows the calculated density of states of the phononic crystal. The observed spike in the low frequency modes is indicative of a large reduction in the phonon group velocity in the phononic crystal lattice.

Once the DOS was found, the thermal conductivity was calculated via Eq. (5). The thermal conductivity of the phononic crystal predicted from the PWE DOS versus L is shown in FIG. 8 as a dashed line. The curve shows excellent agreement with the measured values from the phononic crystal samples, particularly the 3/5 sample, which has the same pore radius as the value used in the simulations. The predictions also show excellent agreement with the thermal conductivity of Yu et al.'s nanomesh sample, indicating that the further reduction observed in the phononic crystal and nanomesh beyond that of Eq. (5) using bulk dispersion is due to the changes in the mode density. This trend is based on calculations at smaller values of L, since the PWE technique becomes too computationally intensive for larger values of L to calculate the modal dispersion up to meaningful frequencies using the resources available at the time of this invention. This is directly related to the fact that thermal energy in Si follows a Bose-Einstein distribution, and thus the majority of the energy is carried by phonons in the 1-6 THz range. Since the size of the PWE computational space grows nonlinearly with maximum mode frequency, this severely limits the largest lattice constant that can be simulated, as the frequency scales directly with the phononic crystal lattice constant. However, the sound agreement between the predicted reduction in κ of the phononic crystals and that measured with TDTR elucidates the role of phonon dispersion and mode density on the further reduction in thermal conductivity of phononic crystals beyond that considering only boundary scattering effects.

In summary, the coherent (i.e. bandgap) and incoherent (i.e. flat bands) effects of nanoscale structures can be directly engineered via a number of topological parameters to optimize the thermal conductivity reduction while maintaining the structural integrity of a thermoelectric device. The measured values for thermal transport processes in single crystalline silicon phononic crystals with sub-micron geometries are over an order of magnitude lower than that of bulk Si. The magnitude of this measured thermal conductivity reduction is much larger than that predicted from accounting for phonon-boundary scattering at the interfaces of the phononic crystal lattice alone. A plane-wave expansion technique was implemented to calculate the phononic density of states of the phononic crystal. The phononic crystal density of states is drastically altered compared to bulk, and predictions of the phononic crystal thermal conductivity agree well with the experimental measurements, indicating that the thermal conductivity is drastically affected by the altered dispersion introduced by the periodically nanostructured nature of phononic crystals.

Reduction in Thermal Conductivity of SiC by Phononic Crystal Patterning

Figure 10:
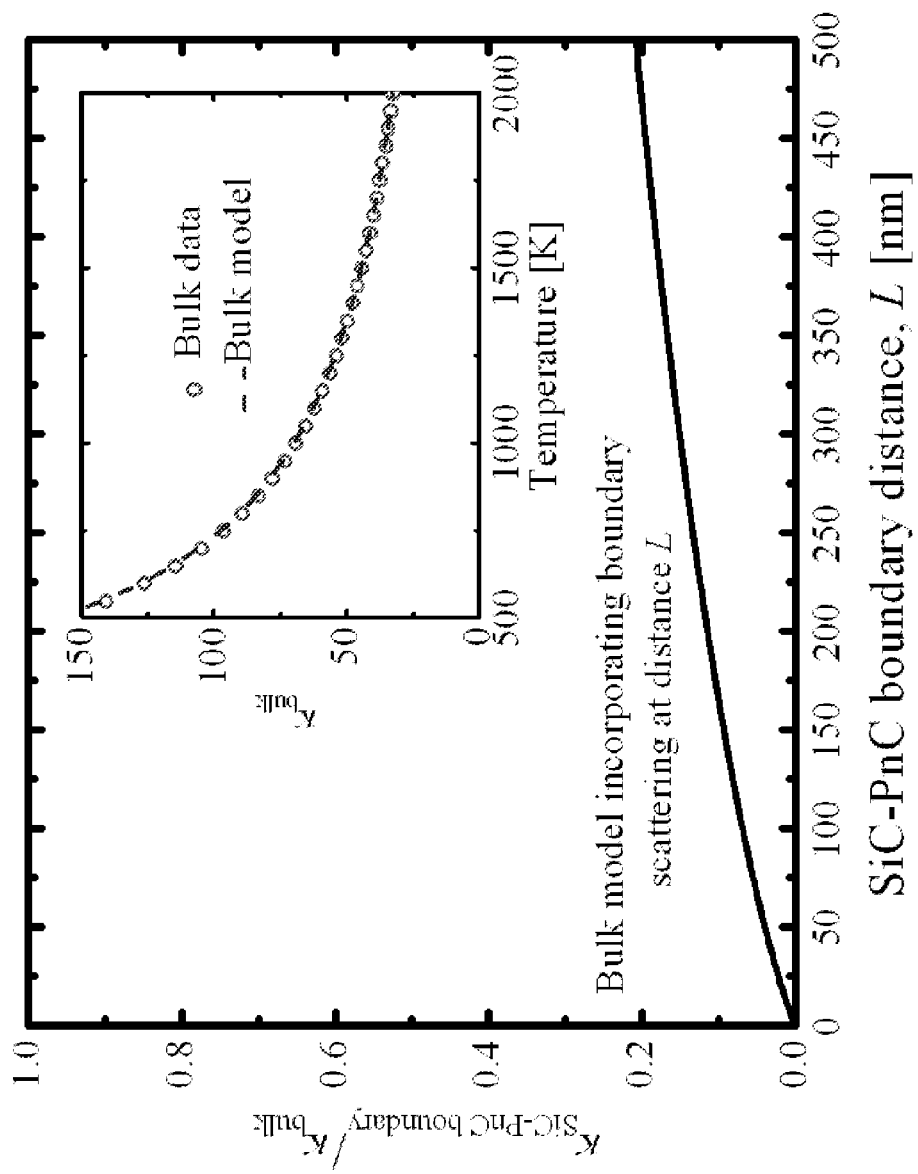
FIG. 10 is a graph of the ratio of the thermal conductivity of SiC—PnC to that of bulk as a function of the minimum feature size, L, of the SiC—PnC. Inset shows the accuracy with which the model predicts bulk behavior. Circles are the actual experimental data, and the dashed line is the result of Eq. (1).
Figure 11:
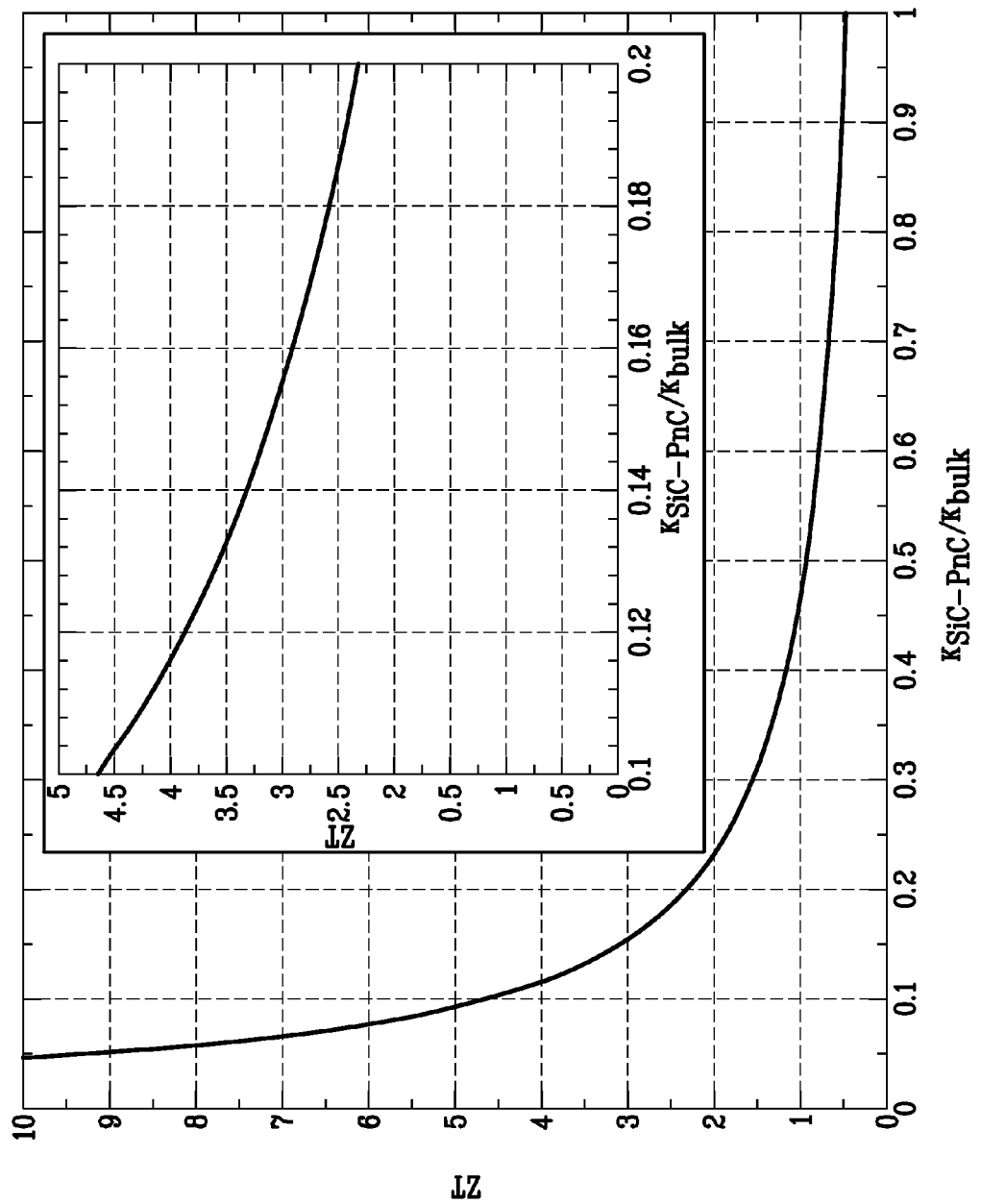
FIG. 11 is a graph of ZT values for SiC—PnC at T=1,000K. Once the thermal conductivity is reduced below 0.2 of the bulk value (80% reduction), ZT increases to a value larger than 2 (ZT>2). Inset shows the resultant ZT values for a thermal conductivity reduction between 0.2-0.1 (80%-to-90%).

There is no fundamental difference in the behavior when the phononic crystal material is changed from Si to SiC. In fact, the phononic crystal behavior can be more pronounced given the increase in the acoustic impedance from 19MΩ in Si to 40MΩ in SiC, leading to a factor of 2 increase in the impedance mismatch between SiC and air as compared to that between Si and air. To predict the amount of thermal conductivity reduction resulting from phonon scattering from the SiC PnC pore edges, the thermal conductivity of nano- and micro-porous systems was modeled as described above. For this prediction, the thermal conductivity of SiC was calculated from the Callaway-Holland-type model. The first step in the calculation is specifying a phonon dispersion for SiC. The exact phonon dispersion in the [0001] direction was used and $4^{th}$ order polynomials were fit to all 36 branches of SiC for evaluation of Eq. (1) as described by Beechem et al. See T. Beechem et al., *Applied Physics Letters* 97, 061907 (2010). To determine the scattering times, Eq. (1) was fit to measured experimental data of SiC, assuming a form of the Umklapp scattering time as given by $\tau_{U,j}^{-1}(q)=AT\omega^2(q)\exp[-B/T]$, where A and B are coefficients determined from the fit. The resulting fit of Eq. (1) assuming only Umklapp scattering to the bulk experimental data is shown in the inset of FIG. 10. Once the Umklapp scattering rate is determined from the bulk fit, the effect of phonon-boundary scattering on thermal conductivity was modeled by taking the scattering time in Eq. (1) as $\tau_j(q)=(\tau_{U,j}^{-1}(q)+v_j(q)/L)^{-1}$, where the second term accounts for (to the first order) phonon-boundary scattering. To examine the effect of boundary scattering on the thermal conductivity at high temperatures, Eq. (1) was used to predict the thermal conductivity of SiC as a function of boundary spacing at 1,000K. The bulk thermal conductivity of SiC at 1,000K is 50 W/mK. See L. M. Ivanova et al., *Inorganic Materials* 42, 1205 (2006); and K. Watari et al., *Journal of the American Ceramic Society* 86, 1812 (2003). As shown in FIG. 11, the thermal conductivity as a function of L can be divided by the corresponding bulk thermal conductivity to show the percentage reduction in κ due to boundary scattering. Note that in a reasonable range of boundary spacing in these SiC phononic crystals, the thermal conductivity can be reduced down to less than 20% of that of bulk SiC. Therefore, at least an 80% reduction in the thermal conductivity of the SiC phononic crystals can be achieved based on boundary scattering alone.

While the phonon propagation can be tremendously influenced by the phononic crystal structuring, no substantial effect on the electron propagation through the structure occurs. This can easily be understood by examining the electron mean free path, $l_e$, which according to the Drude theory is given by:

$$le = \frac{\sigma m^* v_e}{ne^2} \quad (6)$$

In degenerately doped semiconductors, $v_e$ is the Fermi velocity $\sqrt{2\epsilon_F/m^*}$, where $\epsilon_F$ is the Fermi level energy, and m* is the electron effective mass. The Fermi level energy varies with doping and ranges from $\epsilon_F \approx 60\text{-}150$ meV with respect to the valence band. See Y.-C. Chung et al., *Materials Science & Engineering B (Solid-State Materials for Advanced Technology)* 126, 194 (2006); and L. Weber and E. Gmelin, *Applied Physics A (Solids and Surfaces)* A53, 136 (1991). This yields an electron mean free path that is an order of magnitude smaller than the minimum feature size, specifically: $l_e$<20 nm at room temperature and <10 nm at higher temperatures.

ZT of High-Temperature SiC PnC

Highly doped cubic-SiC is reported to have very favorable TE properties that rival the state of the art high-temperature TE materials. Table II summarizes the literature reported optimal parameters for SiC.

TABLE II

Optimal reported values in literature for SiC TE properties.

| SiC TE property | n-type | p-type |
| --- | --- | --- |
| Doping level, N | $2.4 \times 10^{20}/cm^3$ (1) | $10^{21}/cm^3$ (2) |
| Seebeck coefficient, S | $-2000$ μV/K (1) | 600 μV/K (3, 4) |
| Electrical resistivity, ρ | 5 mΩ-cm (1, 4, 5) | 10 mΩ-cm (1) |
| Thermal conductivity, κ | 50 W/mK (6, 7) | 50 W/mK (6, 7) |

(1) J. Lee et al., 15th Int. Conf. on Solid State Sensors, Actuators, and Microsystems, Denver, CO, pp. 1861-1864 (2009)
(2) V. Heera et al., J. Appl. Phys. 99, 123716-1-8 (2006)
(3) C.-H. Pai, Seventh Int. Conf. on Thermoelectrics, Nagoya, Japan, pp. 582-586 (1998)
(4) X. H. Wang et al.. Science and Technology of Advanced Materials 4, 167 (2003)
(5) F. Schmidt et al., J. Appl. Phys. 91, 9182 (2002)
(6) L. M. Ivanova et al., Inorganic Materials 42, 1205 (2006)
(7) K. Watari et al., J. Amer. Ceramic Society 86, 1812 (2003)

While the n-type Seebeck coefficient reported above was measured at T=700K, a reduction in its value as T is increased to T>1,000K is not expected since S is an increasing function in temperature. See G. J. Snyder and E. S. Toberer, *Nature Materials* 7, 105 (2008). Further, while the thermal conductivity above is for single crystalline SiC, poly-SiC is expected to have lower thermal conductivity.

The TE figure of merit ZT for a doped semiconductor is given by $$Z = \frac{(S_p - S_n)^2 T}{\left(\sqrt{\rho_n \kappa_n} + \sqrt{\rho_p \kappa_p}\right)^2}$$

where σ is the electrical conductivity, κ is the thermal conductivity, S is the Seebeck coefficient or thermopower (conventionally in μV/K), ρ is the electrical resistivity, T is the temperature, and the subscripts n and p denote properties related to the n- and p-type semiconducting thermoelectric materials, respectively. The result under the optimal doping levels reported in the above table is a relatively high bulk material TE figure of merit ZT≈0.5. This thus requires a reduction in the thermal conductivity by 80% or higher to realize a ZT≧2 at 1,000K. As described above, such reduction can be readily realized via phononic crystal technology. In fact, a minimum of 80% and a maximum of 90% reduction in the thermal conductivity of SiC can be expected once patterned into a phononic crystal of a minimum feature size of between 0.5 μm to 0.2 μm. FIG. 11 shows the expected ZT values for a SiC PnC device at T=1,000K. As is evident, once the thermal conductivity is reduced below 80% (at a minimum feature size of L=500 nm or less), the figure-of-merit for a poly-SiC PnC device is ZT>2 at T=1,000K.

Thermoelectric Devices Fabricated Using Synthetic Thermoelectric Materials

Figure 12:
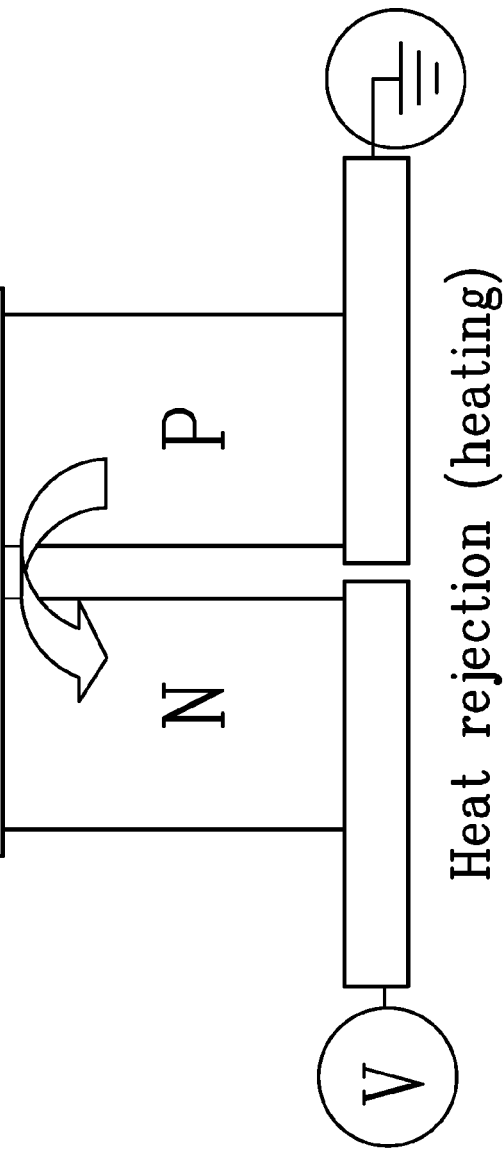
FIG. 12 is a conceptual illustration of a thermoelectric cooler.

The present invention is also directed to thermoelectric devices fabricated using synthetic thermoelectric materials comprising phononic crystals. A thermoelectric device creates a voltage when there is a different temperature on each side of the device or, when a voltage is applied to it, the device creates a temperature difference. For example, a thermoelectric cooler, sometimes called a Peltier cooler, is a semiconductor-based electronic device that functions as a small heat pump. As shown in FIG. 12, by applying a low voltage DC power source to a thermoelectric cooler, heat can be moved through the cooler from one side to the other. Electrons in the n-type element move opposite the direction of the current and holes in the p-type element move in the direction of the current, both movements removing heat from one side of the device. The diffusing charges are scattered by impurities, imperfections, and phonons moving against the thermal gradient. Alternatively, the device can be configured as a thermoelectric generator when a heat source is provided, wherein mobile charge carriers migrating to the cold side leave behind their oppositely charged nuclei at the hot side, thus giving rise to a thermoelectric voltage (Seebeck effect) and a current through an electrical circuit.

Planar SiC PnC Thermoelectric Generator

Figure 13:
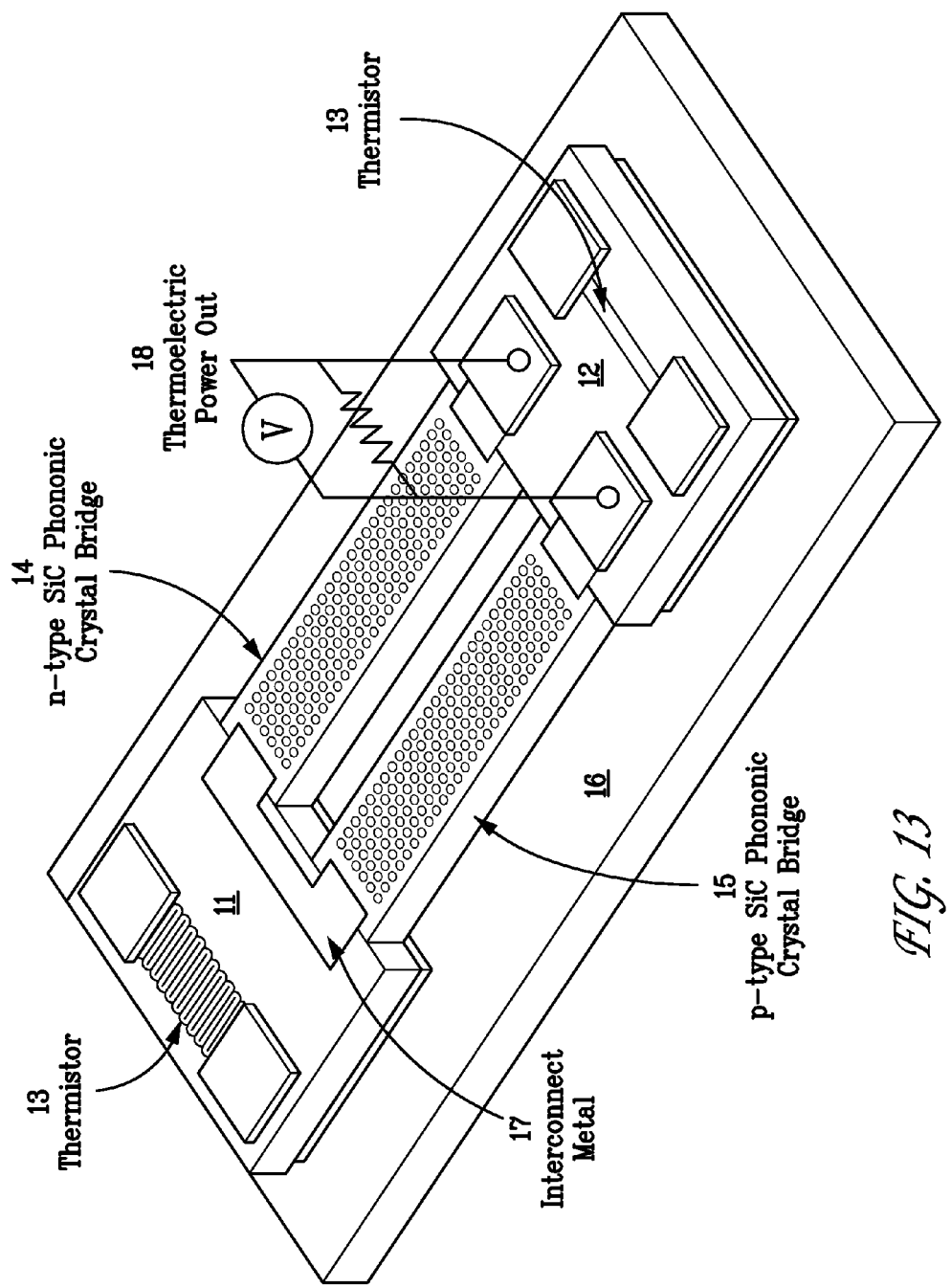
FIG. 13 is a schematic illustration of a planar high-ZT, high-temperature SiC PnC thermoelectric generator.

As an example of the present invention, FIG. 13 shows a schematic illustration of a thermoelectric generator comprising n-type and p-type SiC two-dimensional phononic crystals arranged in a co-planar structure. The generator comprises a hot side 11 and a cold side 12. The hot side and cold side can also comprise thermisters 13 to sense temperature. In this device, an n-type SiC phononic crystal bridge 14 and a p-type SiC phononic crystal bridge 15 are suspended above a SiC substrate 16 for thermal isolation. The hot side of the n-type and p-type SiC phononic crystals are connected electrically by an interconnect metallization 17. An external thermoelectric power circuit 18 connects the cold ends of the n-type and p-type SiC phononic crystals to extract thermoelectric power from the device. When a heat source is applied to the hot side, a voltage is generated in the power circuit, according to $$V_{out} = (S_n - S_p)(T_h - T_c)$$

where $S_n$ is the Seebeck coefficient of the n-type SiC phononic crystal, $S_p$ is the Seebeck coefficient of the p-type SiC phononic crystal, $T_h$ is the hot-side temperature and $T_c$ is the cold-side temperature. Alternatively, by passing current through the device, heat can be transferred between hot and cold sides to provide a thermoelectric cooler. The transfer of heat can be quantified by monitoring the thermisters. Further, an array of co-planar pairs of such n-type and p-type phononic crystal bridges can be formed between the hot and cold sides to provide a thermopile. The pairs can be connected in series or parallel in order to match the source resistance to the load resistance. For example, the co-planar pairs can be connected in series to provide a higher output voltage. Alternatively, the n-type bridges can be connected to the other n-type bridges in parallel and the p-type bridges can be connected in parallel. Such a parallel-connected array provides a lower output voltage, but a lower source resistance.

Fabrication of SiC PnC Thermoelectric Generator

As an example of the present invention, a high-ZT, high-temperature PnC—SiC thermoelectric device can be fabricated as shown in FIG. 14. The fabrication process can use ultra high quality factor, low stress SiC film deposition, polishing and etching.

Figure 14A:
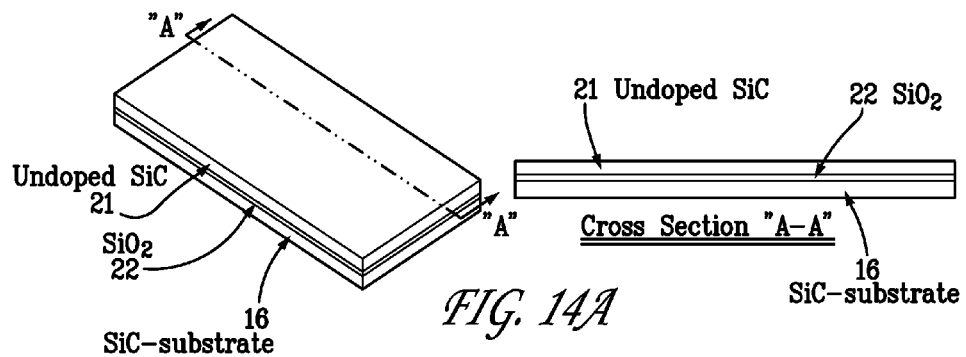
FIGS. 14(a)-(e) are perspective top view and side view illustrations of a method to fabricate the planar high-ZT, high-temperature SiC PnC thermoelectric generator.

As shown in FIG. 14(a), an undoped SiC layer 21 can be grown on top of a $SiO_2$ layer 22 on a SiC substrate 16 via a low pressure chemical vapor deposition (LPCVD) by combining dichlorine silane (DCS) and dichlorine ethane (DCE) gases at 850° C. A high grade polycrystalline cubic-SiC layer 21 with a surface roughness of less than 20 nm can be formed with less than 100 MPa film stress. The underlying oxide layer 22 serves to thermally insulate the anchors from the substrate 16 after the device is released.

Figure 14B:
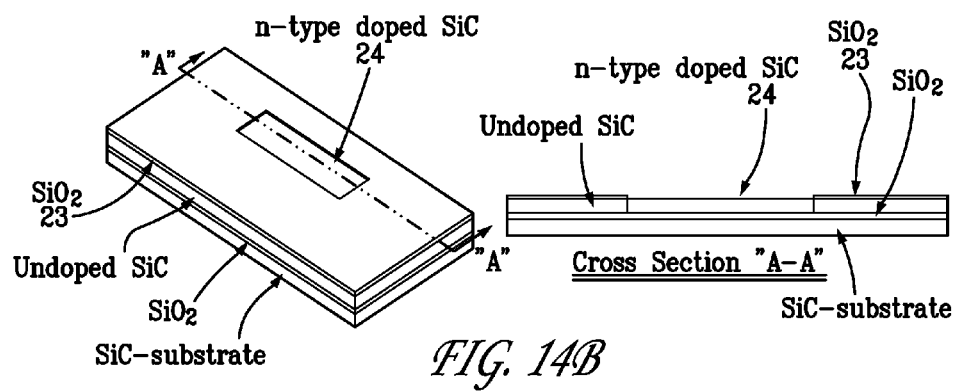
Figure 14C:
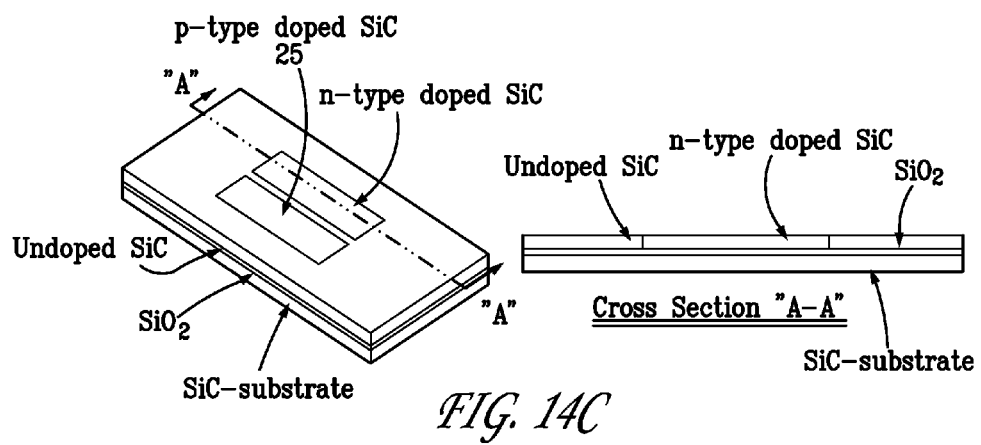

As shown in FIGS. 14(b) and 14(c), the SiC layer 21 can be selectively doped both n-type and p-type by ion-implantation. Ion implantation with oxide masking enables selective regional doping control. As shown in FIG. 14(b), a donor element can be implanted using an oxide hard mask 23 to form an n-type doped SiC region 24. For n-type doping, nitrogen has been the most widely used donor element because it possesses both low atomic mass and low ionization energy. See J. A. Gardner et al., Journal of *Applied Physics* 83, 5118 (1998); and T. Kimoto et al., *Materials Science Forum* 264-268, 675 (1998). Recently, it has shown that phosphorus can be used as the donor element in SiC for high-dose, low resistivity applications, i.e. using high concentrations of phosphorus ($2.4 \times 10^{20}$ cm$^{-3}$) implanted at 800K in a 4-H SiC film followed by annealing at 1,700° C. for 30 min., measured sheet resistances of 29Ω/□ with a depth of 0.8 μm can be achieved. The resistivity is expected to be around 4 mΩ·cm at 1,000K. See F. Schmid et al., *Journal of Applied Physics* 91, 9182 (2002); and M. A. Capano et al., *Journal of Applied Physics* 87, 8773 (2000). Then, as shown in FIG. 14(c), another oxide hard mask can be prepared for p-type doping followed by acceptor element implantation to form a p-type SiC region 25. Among several acceptor elements, aluminum has been the most preferred due to its relatively low ionization energy compared to other candidates, such as boron or gallium. Recently, p-type doped SiC films with resistivity values less than 80 mΩ·cm at room temperature and 10 mΩ·cm at 1,000K (with a depth of 0.7 um) have been reported by aluminum implantation with a concentration of $1.5 \times 10^{21}$ cm in a 4-H SiC substrate at 400° C. followed by a 10 min. anneal at 1,600° C. See V. Heera et al., *Journal of Applied Physics* 99, 123716-1-8, (2006). The high temperature annealing activates the implanted ions followed by removal of oxide hard masks. The fabrication process can be deliberately developed for stress control required in such high temperature processes.

Figure 14D:
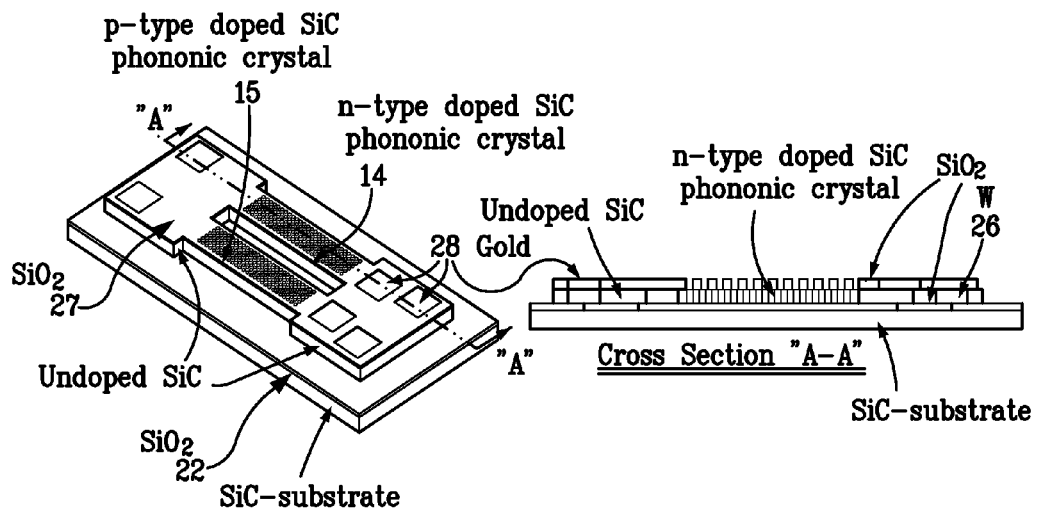
Figure 15:
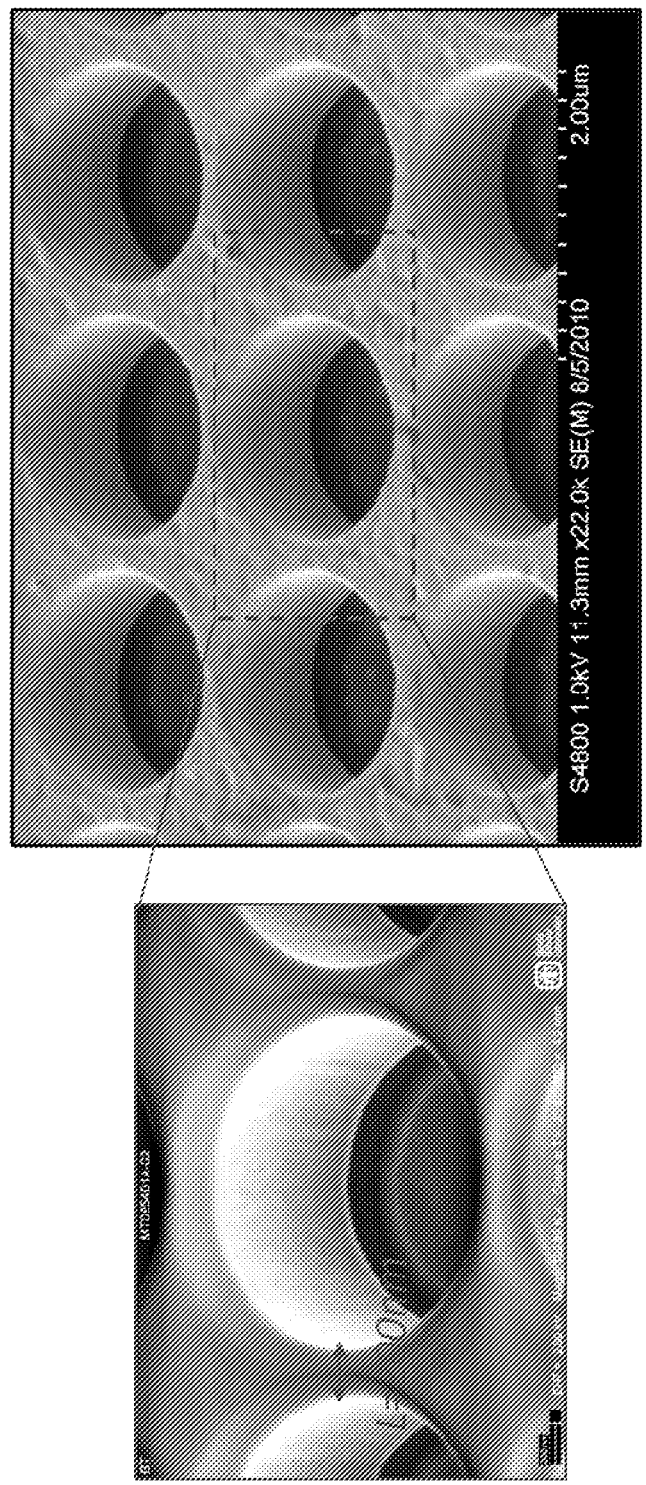
FIG. 15 is an SEM image of a fabricated SiC—PnC with a minimum feature size of L=200 nm.

As shown in FIG. 14(d), trenches can be formed by SF$_6$ dry-etching of the SiC layer in the places where the metallic interconnect 17, thermoelectric power circuit connections 18, and thermisters 13 are to be located on the hot and cold sides 11 and 12. Tungsten 26 can be used for these metal lines due to its extremely high melting temperature. Tungsten can be filled inside these trenches via extremely conformal chemical vapor deposition (CVD). Chemical mechanical polishing (CMP) can be used to remove the deposited tungsten film on top of the SiC layer. Using this polishing process, the surface roughness of the SiC layer can be significantly improved to less than 1 nm. The n-type and p-type SiC phononic crystals 14 and 15 can be fabricated by an additional SF$_6$ dry-etch using another oxide hard mask 27. Using high-precision optical lithography and controlled over-etch, feature sizes as small as 200 nm can be reliably patterned and fabricated. FIG. 15 shows an example SEM image of a phononic crystal structure with a minimum feature size of 200 nm in a 1 μm-thick SiC layer. After patterning devices, openings for bond-pads can be patterned in the oxide hard mask layer. Using a lift-off method, the bonds pads 28 for the thermisters and thermoelectric power out or in can be fabricated on top of tungsten by evaporation of gold.

Figure 14E:
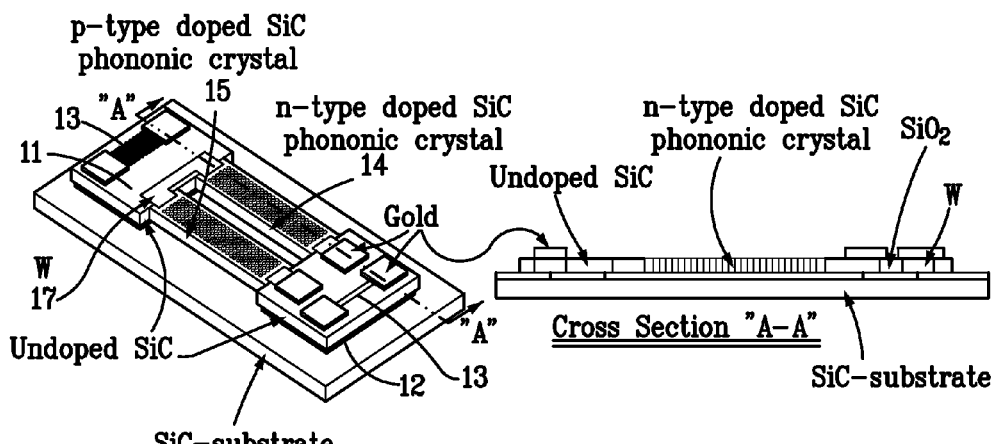

As shown in FIG. 14(e), both the top and bottom oxide layers 27 and 22 can be removed via isotropic vapor phase hydrofluoric acid (HF) etching to release the device. Vapor phase etching prevents unwanted snap-down or stiction of the released device. Etch time can be controlled so that the oxide anchors still survive while the oxide underneath the phononic crystal devices is removed for suspension of the thermoelectric layers and thermal isolation from the substrate. Palladium, platinum, or gold wires can be wire-bonded to the gold bond pads for connection to the external electrical circuits.

Modular Si—PnC Thermoelectric Cooler

Figure 16:
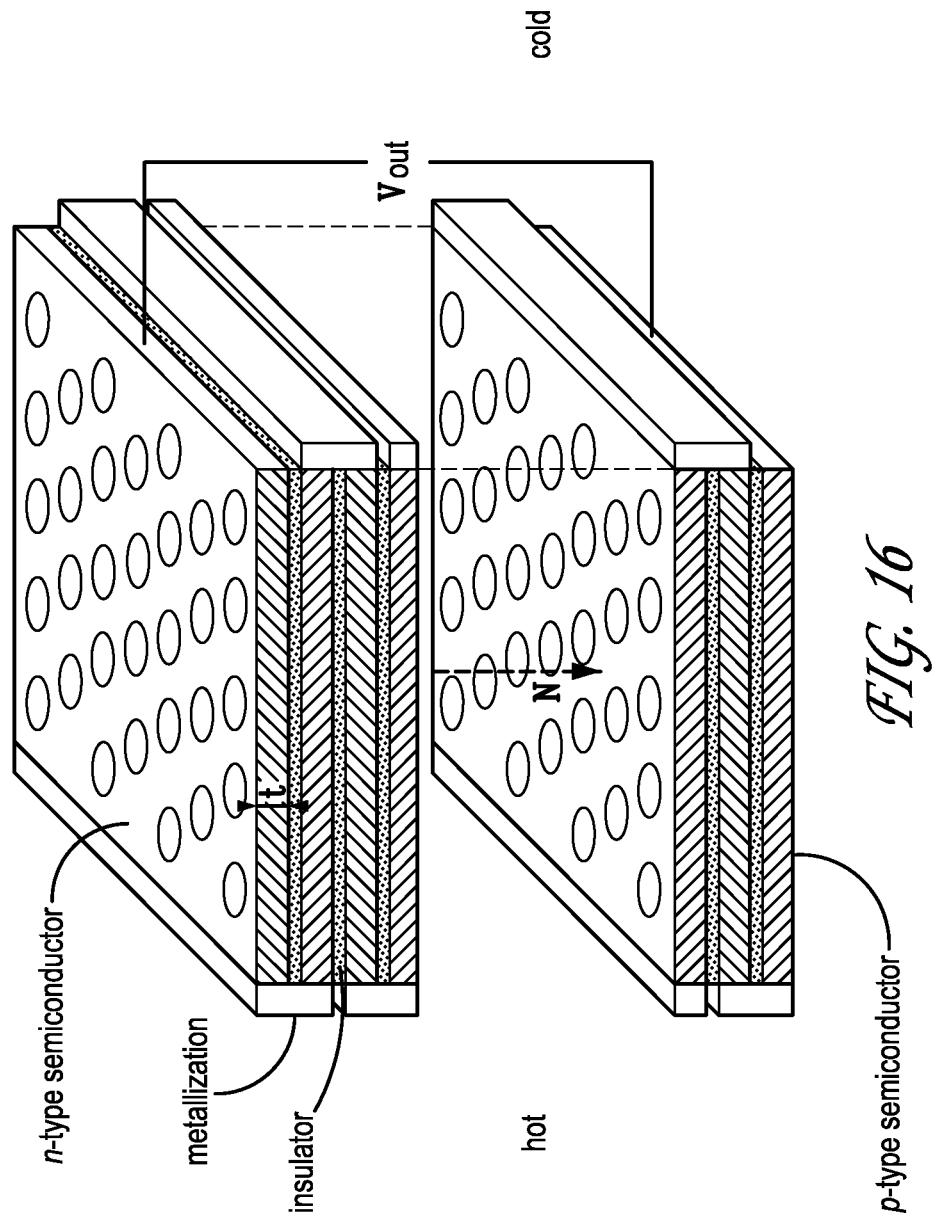
FIG. 16 is a schematic illustration of a Si PnC thermoelectric cooler.

FIG. 16 shows a schematic illustration of a thermoelectric device comprising alternating layers of n- and p-type semiconductor two-dimensional phononic crystals that can be connected by metallic conductors. Pairs of the alternating layers can be stacked layer-by-layer to provide a module comprising a plurality (N) of pairs of n-type and p-type semiconductor phononic crystal layers. The pairs of n-type and p-type layers can be connected by the metallization in series (as shown). Alternatively, the sides of the n-type layers can be connected to the sides of the other n-type layers in parallel and the p-type layers can be similarly connected in parallel. The thermoelectric layers can have an insulating layer therebetween (as shown), although the insulating layer is not necessary. The stacked modules can provide a thermoelectric generator or a thermoelectric cooler.

Figure 17:
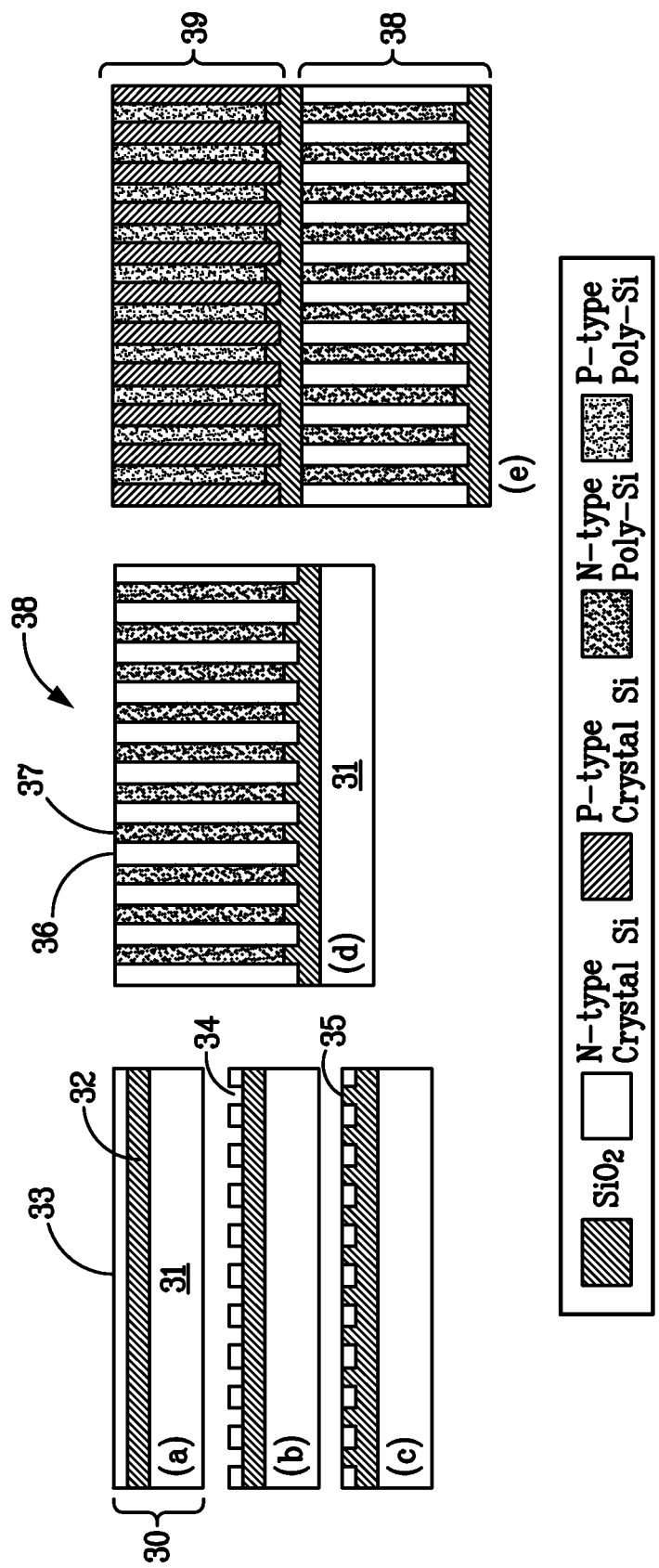
FIG. 17 shows a fabrication process for the TE cooler module shown in FIG. 16.

As an example of the present invention, highly doped silicon can be used as the semiconductor material. An exemplary TE device module fabrication process using highly doped Si is shown in FIG. 17. As shown in FIG. 17(a), the process flow begins with a silicon-on-insulator (SOI) wafer 30, comprising a top doped silicon layer 33 separated from a silicon substrate 31 by a buried SiO$_2$ layer 32. In this example, the top doped silicon layer can comprise highly n-doped silicon. The highly n-doped top Si layer can be sufficiently thin to allow patterning to form a phononic crystal. For example, the phononic crystal can comprise 20-75 nm filled holes. As shown in FIG. 17(b), air holes 34 of 20-75 nm diameter centered on a 40-150 nm pitch can be patterned in the top-Si layer. The phononic lattice patterning can be achieved using nano-imprint lithography or optical lithography. As shown in FIG. 17(c), the nano-patterned holes can be backfilled with SiO$_2$ 35 using oxide deposition followed by chemical-mechanical-polishing (CMP). As shown in FIG. 17(d), to transfer the thin, nano-patterned phononic crystal into a much thicker structure, a highly doped (1 mΩ-cm), 30-50 μm thick n-type epitaxial Si film can be deposited on the surface of the wafer. Epitaxial silicon 36 will be deposited in the areas where single crystal silicon 33 is exposed while polycrystalline silicon 37 will be deposited over the oxide inclusions 35, thus forming a thick (30-50 μm) Si/PolySi phononic lattice with a lattice constant of 40-150 nm. As described above, scattering at the Si/PolySi interface decreases the phonon mean free path inside the crystal reducing the thermal conductivity with minimal effect on the electrical conductivity. As shown in FIG. 17(e), the n-type phononic crystal wafer 38 can be bonded to a previously (using the same process) fabricated p-type Si phononic lattice 39 and the Si handle wafer 31 can be removed. Many wafers can be bonded together in this manner to achieve the overall number of stacked layers and cooler cross-section. Increasing the thickness of the epi-Si film reduces the number of silicon layers that must be bonded together and overall assembly costs. Once all the wafers are bonded together, the wafer stack can be diced and electrical connections between the n- and p-type silicon layers can be made. For example, up to 99, 2×2×0.5 cm stacked modules can be fabricated from a single 6 inch wafer stack.

Figure 18:
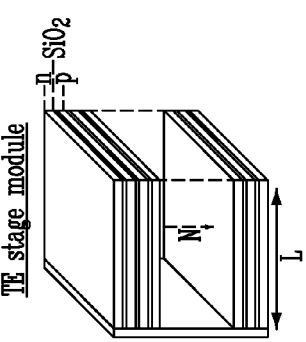
FIG. 18 is a table of the approximate sizes and performance per TE cooler module.

The stacked modules can be used as a thermoelectric cooler. FIG. 18 provides approximate sizes and performance for a stacked module comprising alternating unpatterned n- and p-type silicon layers, and two different stacked modules comprising alternating layers of n- and p-type silicon phononic crystals. The first column shows the predicted performance of a thermoelectric cooler comprising 100 wafer-bonded unpatterned active cooling pairs. The stack has a volume of 2 cm×2 cm×1 mm, with each cooling pair comprising two 2 cm×2 cm×100 μm doped n- and p-type Si layers. The lattice thermal conductivity is about 140 W/mK. This cooler is predicted to consume about 044 A at 2.22 V with a current density of about 0.022 kA/cm². The rate of cooling is about 5 W. The second column shows the predicted performance of a thermoelectric cooler comprising 100 wafer-bonded phononic crystal active cooling pairs. The stack has a volume of 2 cm×2 cm×0.095 mm. The lattice thermal conductivity is reduced to about 1.555 W/mK by means of phononic crystal patterning of the active cooling pairs. The cooler is predicted to consume about 9.14 A at 4.34 V with a current density of about 0.457 kA/cm². The rate of cooling is about 100 W. The third column shows the predicted performance of another thermoelectric cooler comprising 100 wafer-bonded phononic crystal active cooling pairs, wherein the stack has volume of 2 cm×2 cm×0.065 mm. The lattice thermal conductivity is further reduced to about 0.5 W/mK by optimizing the phononic crystal patterning of the active cooling pairs. The cooler is predicted to have an improved power requirement at about 7.54 A at 2.45 V with a current density reduced to about 0.377 kA/cm². The rate of cooling is about 100 W.

Figure 19:
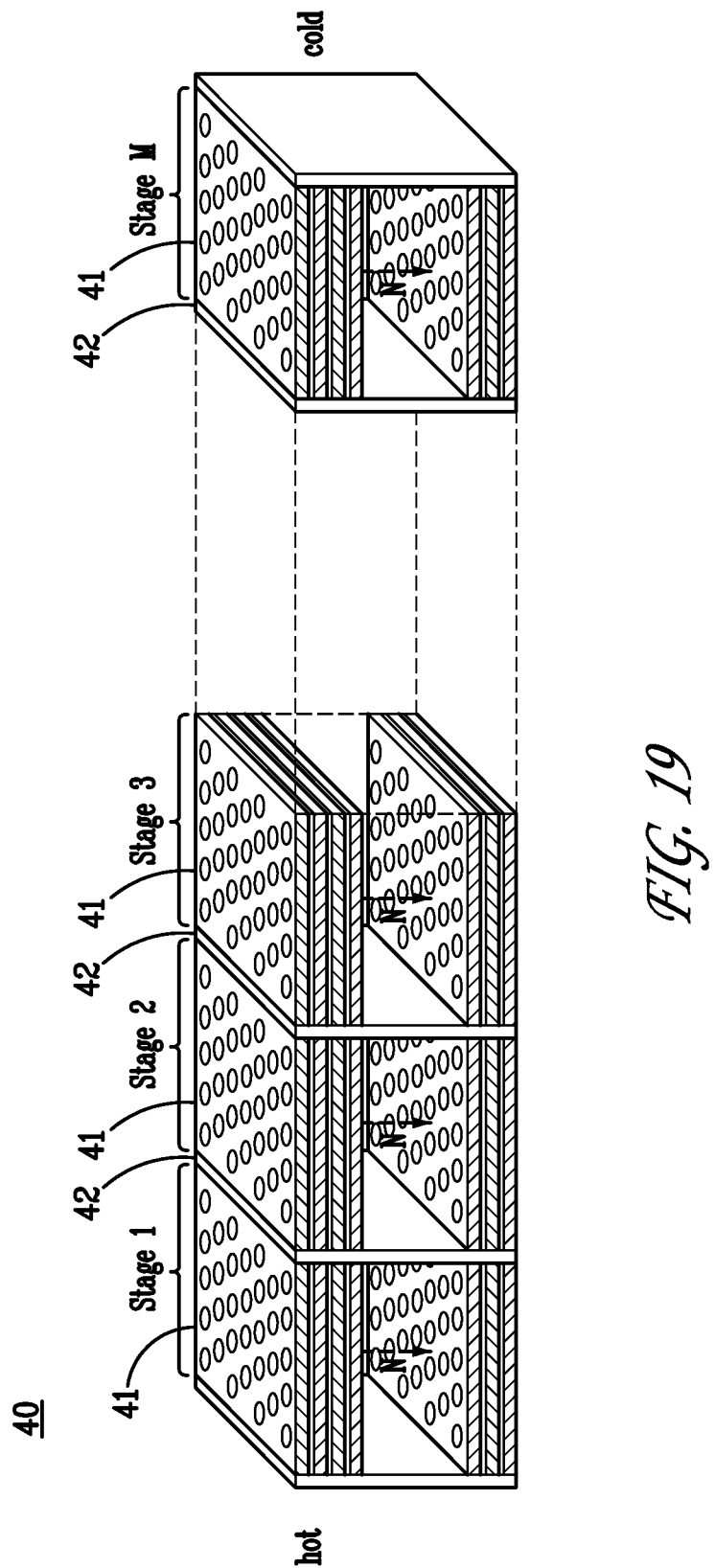
FIG. 19 is a schematic illustration of a cascaded thermoelectric device comprising identical module stages.
Figure 20:
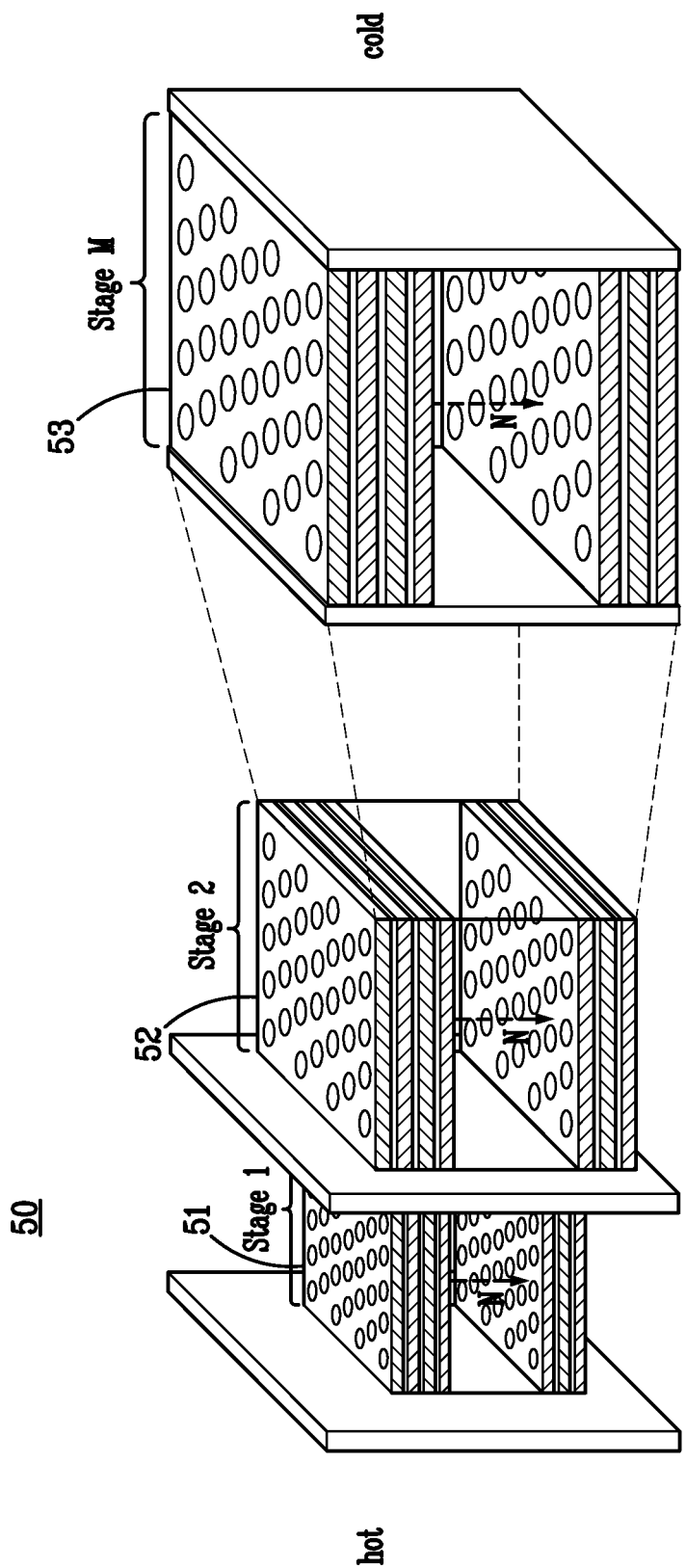
FIG. 20 is a schematic illustration of a cascaded thermoelectric device comprising pyramidal shaped module stages.

To provide a thicker device with better mechanical robustness, cascaded stages of TE modules separated by an interface can be used. As shown in FIG. 19, a cascaded thermoelectric device 40 can comprise identical stacked modules 41 that are staged side-to-side between a hot side and a cold side. This cascaded device has negligible losses due to interfaces 42 and changes of cooling rate among the stages 41. Alternatively, as shown in FIG. 20, a cascaded thermoelectric device 50 can comprise a pyramidal shape to account for and counteract losses and fluctuations in cooling power by making stage surface areas larger as heat is pumped from the hot side to the cold side through multiple stages 51, 52, and 53.

The present invention has been described as a synthetic thermoelectric material comprising phononic crystals. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A synthetic thermoelectric material, comprising a phononic crystal comprising a periodic array of scattering centers embedded in a host matrix, wherein the scattering center material has a sufficiently different acoustic impedance from the host matrix material to create a phononic bandgap that reduces thermal conductivity, and wherein the host matrix material comprises a thermoelectric material.

2. The synthetic thermoelectric material of claim 1, wherein the periodic array comprises a two-dimensional array.

3. The synthetic thermoelectric material of claim 1, wherein the periodic array comprises a one- or a three-dimensional array.

4. The synthetic thermoelectric material of claim 1, wherein the thermoelectric material comprises an n- or p-type semiconductor.

5. The synthetic thermoelectric material of claim 4, wherein the n- or p-type semiconductor comprises doped silicon.

6. The synthetic thermoelectric material of claim 4, wherein the n- or p-type semiconductor comprises doped silicon carbide.

7. The synthetic thermoelectric material of claim 1, wherein the scattering center material comprises air.

8. The synthetic thermoelectric material of claim 1, wherein the scattering center material comprises silicon oxide, polysilicon, or tungsten.

9. The synthetic thermoelectric material of claim 1, wherein the phononic bandgap provides a reduced thermal conductivity of the synthetic thermoelectric material compared to the thermoelectric material.

10. A thermoelectric device, comprising:
a first synthetic thermoelectric material layer comprising a phononic crystal comprising a two-dimensional periodic array of scattering centers embedded in a host matrix comprising a n-type semiconductor thermoelectric material, wherein the scattering center material has a different acoustic impedance than the host matrix material; and
a second synthetic thermoelectric material layer comprising a phononic crystal comprising a two-dimensional periodic array of scattering centers embedded in a host matrix comprising a p-type semiconductor thermoelectric material, wherein the scattering center material has a different acoustic impedance than the host matrix material; and
wherein the first and second synthetic thermoelectric material layers are electrically connected at a hot side to provide a first pair of synthetic thermoelectric material layers, and the opposite cold sides of the first pair are connected via a thermoelectric power circuit.

11. The thermoelectric device of claim 10, wherein the first pair of synthetic thermoelectric material layers are arranged as co-planar layers.

12. The thermoelectric device of claim 10, wherein the first pair of synthetic thermoelectric material layers are arranged as stacked layers.

13. The thermoelectric device of claim 12, further comprising at least one additional pair of synthetic thermoelectric material layers stacked layer-by-layer with the first pair of stacked layers to provide a first module.

14. The thermoelectric device of claim 13, further comprising at least one additional module staged side-by-side with the first module to provide a cascaded thermoelectric device.

15. The thermoelectric device of claim 10, further comprising at least one additional pair of synthetic thermoelectric material layers connected in series with the first pair.

16. The thermoelectric device of claim 10, further comprising at least one additional pair of synthetic thermoelectric material layers connected in parallel with the first pair.

17. The thermoelectric device of claim 10, wherein a voltage is generated in the thermoelectric power circuit when heat is applied to the hot side, thereby providing a thermoelectric generator.

18. The thermoelectric device of claim 10, wherein heat is extracted from the hot side when a voltage is applied to the thermoelectric power circuit, thereby providing a thermoelectric cooler.

19. The thermoelectric device of claim 10, wherein the n-type semiconductor thermoelectric material comprises n-doped silicon or silicon carbide.

20. The thermoelectric device of claim 10, wherein the p-type semiconductor thermoelectric material comprises p-doped silicon or silicon carbide.

* * * * *